United States Patent
Wakabayashi

(10) Patent No.: US 10,735,651 B2
(45) Date of Patent: *Aug. 4, 2020

(54) SOLID-STATE IMAGING DEVICE AND DRIVING METHOD OF SOLID-STATE IMAGING DEVICE, AND ELECTRONIC EQUIPMENT

(71) Applicant: Sony Corporation, Tokyo (JP)

(72) Inventor: Hayato Wakabayashi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/439,133

(22) Filed: Jun. 12, 2019

(65) Prior Publication Data

US 2020/0007765 A1   Jan. 2, 2020

Related U.S. Application Data

(63) Continuation of application No. 15/813,892, filed on Nov. 15, 2017, now Pat. No. 10,375,309, which is a
(Continued)

(30) Foreign Application Priority Data

Jul. 6, 2012   (JP) ................... 2012-152172
Dec. 26, 2012   (JP) ................... 2012-282198

(51) Int. Cl.
*H04N 5/232*   (2006.01)
*H01L 27/146*   (2006.01)
(Continued)

(52) U.S. Cl.
CPC ... *H04N 5/23241* (2013.01); *H01L 27/14609* (2013.01); *H01L 27/14634* (2013.01);
(Continued)

(58) Field of Classification Search
CPC .. H04N 5/23241; H04N 5/3745; H04N 5/378; H04N 5/379; H04N 5/3698
See application file for complete search history.

(56) References Cited

U.S. PATENT DOCUMENTS

| | | |
|---|---|---|
| 4,764,846 A | 8/1988 | Go |
| 6,141,691 A | 10/2000 | Frink |

(Continued)

FOREIGN PATENT DOCUMENTS

| | | |
|---|---|---|
| CN | 101228631 A | 7/2008 |
| CN | 101859761 A | 10/2010 |

(Continued)

OTHER PUBLICATIONS

Extended European Search Report dated Apr. 3, 2016, for corresponding European Application No. 13812563.8.
(Continued)

*Primary Examiner* — Antoinette T Spinks
(74) *Attorney, Agent, or Firm* — Michael Best & Friedrich LLP

(57) ABSTRACT

The solid-state imaging device of the present disclosure includes a signal processing unit including an AD converter that digitizes an analog pixel signal read from each pixel of the pixel array unit to a signal line, the signal processing unit transferring digitized pixel data at a first speed higher than a frame rate; a memory unit that stores the pixel data transferred from the signal processing unit; a data processing unit that reads pixel data at a second speed lower than the first speed from the memory unit; and a control unit that, when the pixel data is read from the memory unit, controls to stop operation of a current source connected with the signal line and operation of at least the AD converter of the signal processing unit.

20 Claims, 19 Drawing Sheets

Related U.S. Application Data continuation of application No. 15/443,092, filed on Feb. 27, 2017, now Pat. No. 9,848,147, which is a continuation of application No. 14/405,045, filed as application No. PCT/JP2013/065047 on May 30, 2013, now Pat. No. 9,609,213.

(51) Int. Cl.
*H04N 5/3745* (2011.01)
*H04N 5/378* (2011.01)
*H04N 5/369* (2011.01)

(52) U.S. Cl.
CPC .. *H01L 27/14636* (2013.01); *H01L 27/14643* (2013.01); *H04N 5/3698* (2013.01); *H04N 5/378* (2013.01); *H04N 5/379* (2018.08); *H04N 5/3745* (2013.01); *H04N 5/37455* (2013.01)

(56) References Cited

U.S. PATENT DOCUMENTS

| | | | |
|---|---|---|---|
| 6,150,724 | A | 11/2000 | Wenzel |
| 8,471,384 | B2 | 6/2013 | Lin |
| 8,901,749 | B2 | 12/2014 | Kim |
| 9,634,060 | B2 | 4/2017 | Shizukuishi |
| 2001/0033188 | A1 | 10/2001 | Aung |
| 2004/0021788 | A1 | 2/2004 | Shizukuishi |
| 2006/0022862 | A1 | 2/2006 | Egawa |
| 2006/0103748 | A1 | 5/2006 | Mabuchi |
| 2007/0146514 | A1 | 6/2007 | Maeda |
| 2007/0195491 | A1 | 8/2007 | Honda |
| 2008/0049121 | A1 | 2/2008 | Tsujimura |
| 2010/0053399 | A1 | 3/2010 | Nishi |
| 2010/0181660 | A1 | 7/2010 | Galera |
| 2010/0258890 | A1 | 10/2010 | Ahn |
| 2010/0276572 | A1 | 11/2010 | Iwabuchi |
| 2011/0075162 | A1 | 3/2011 | Saettel |
| 2011/0148850 | A1 | 6/2011 | Kadota |
| 2011/0254024 | A1 | 10/2011 | Chao |
| 2012/0307030 | A1 | 12/2012 | Blanquart |
| 2014/0240566 | A1 | 8/2014 | Shizukuishi |
| 2014/0312491 | A1 | 10/2014 | Jin |
| 2014/0361441 | A1 | 12/2014 | Bae |
| 2017/0092554 | A1 | 3/2017 | Abe |

FOREIGN PATENT DOCUMENTS

| | | | |
|---|---|---|---|
| EP | 2528093 | A1 | 7/2011 |
| JP | 2000-341577 | A | 12/2000 |
| JP | 2004-064410 | A | 2/2004 |
| JP | 2006-042033 | A | 2/2006 |
| JP | 2006-319513 | A | 11/2006 |
| JP | 2007-142738 | A | 6/2007 |
| JP | 2010-074243 | A | 4/2010 |
| JP | 2010-153981 | A | 7/2010 |
| JP | 2011-0254988 | A1 | 10/2011 |
| JP | 2012-0147209 | | 6/2012 |
| KR | 20080019652 | A | 3/2008 |
| KR | 20100112852 | A | 10/2010 |
| KR | 20120111730 | A | 10/2012 |
| WO | WO-2006/129762 | A1 | 12/2006 |

OTHER PUBLICATIONS

Chinese Office Action dated May 4, 2017, for corresponding Chinese Application No. 201380035054.5.

European Office Communication Pursuant to 94 (C) EPC dated Sep. 13, 2018, for corresponding European Application No. 13812563.8.

Chinese Office Action dated Jul. 2, 2018, for corresponding Chinese Application No. 201710839632.0.

Korean Office Action dated Aug. 27, 2019 for corresponding Korean Application No. 10-2014-7035801.

FIG. 8
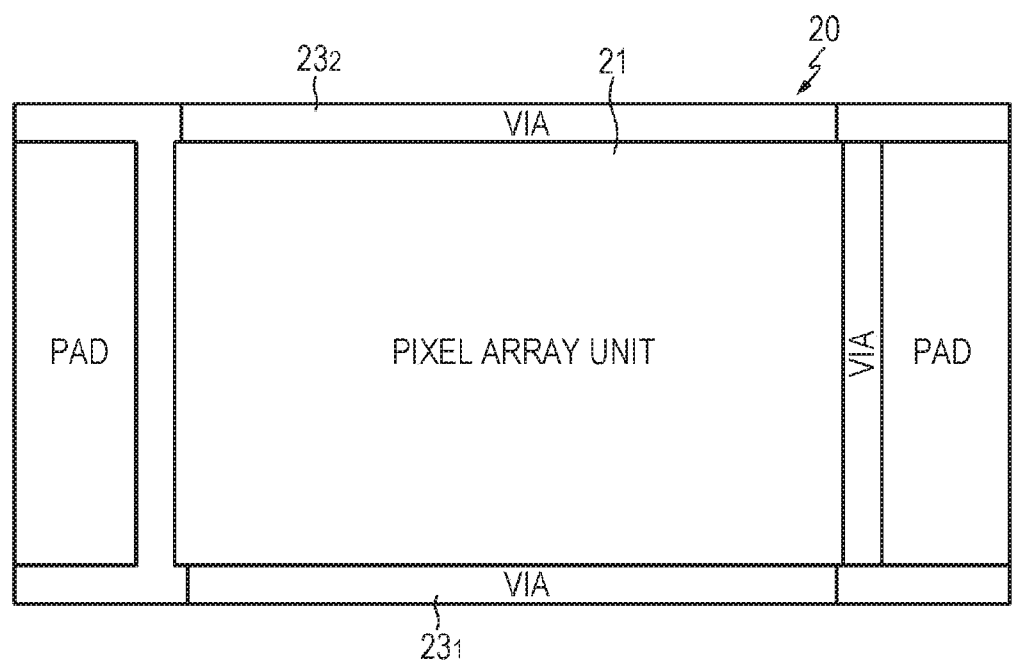
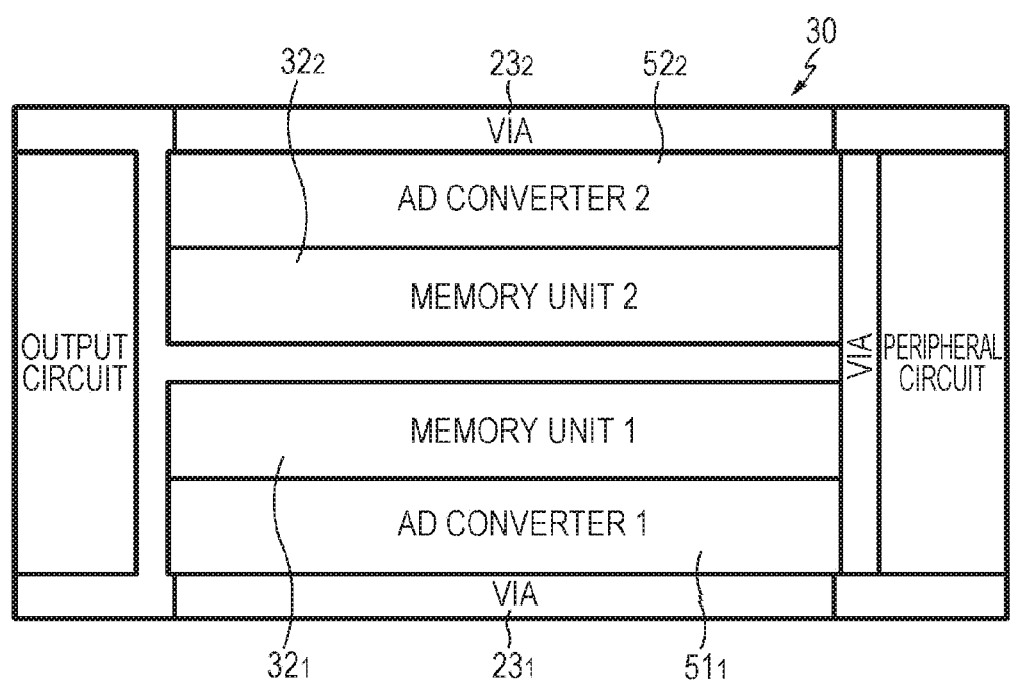

FIG. 14
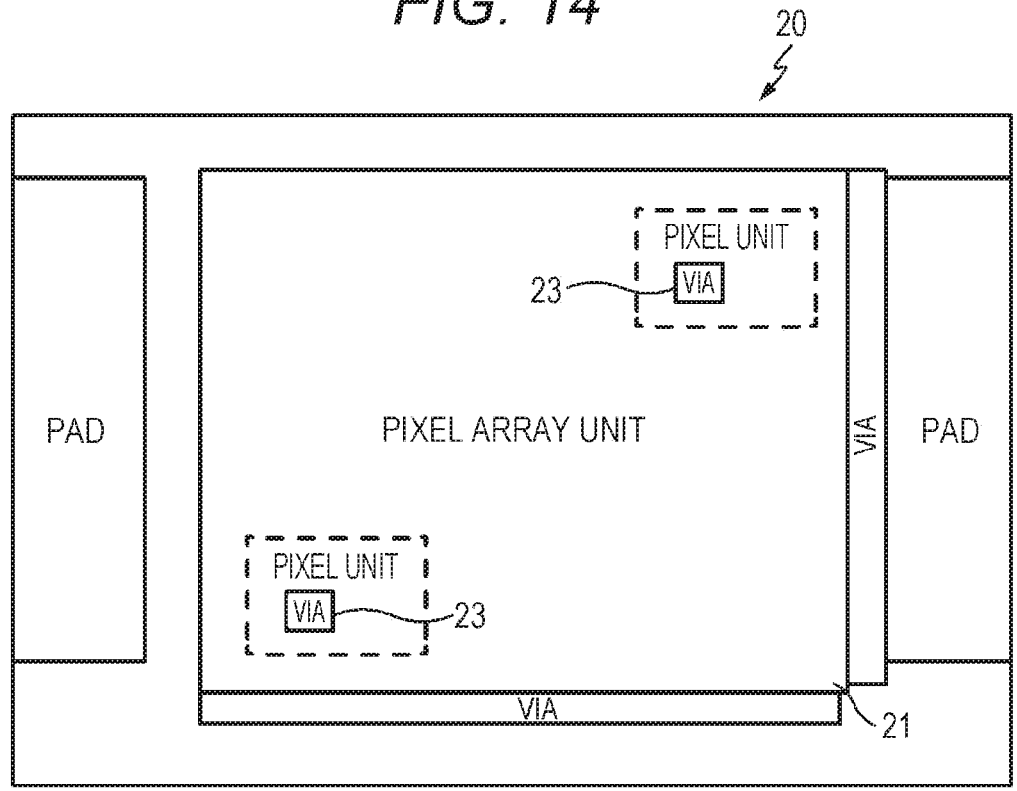
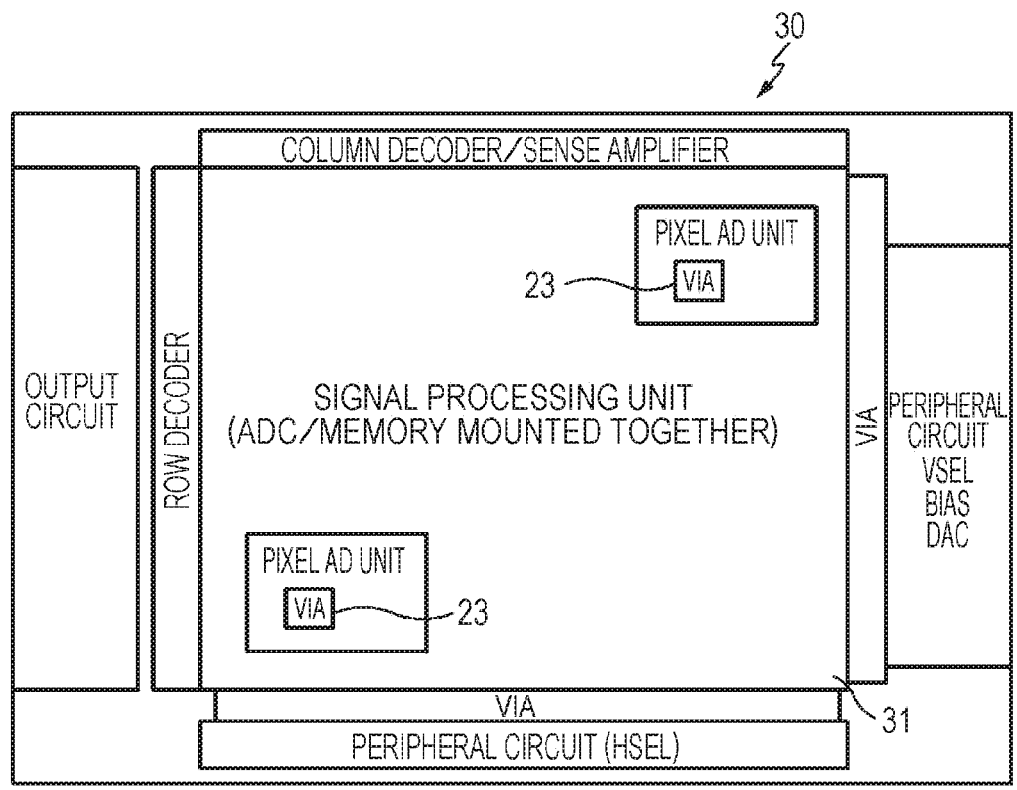

FIG. 18
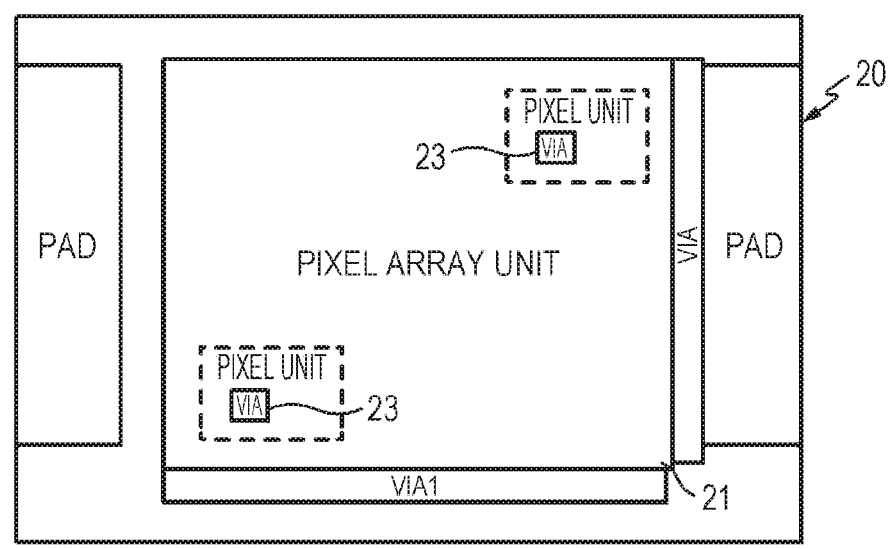
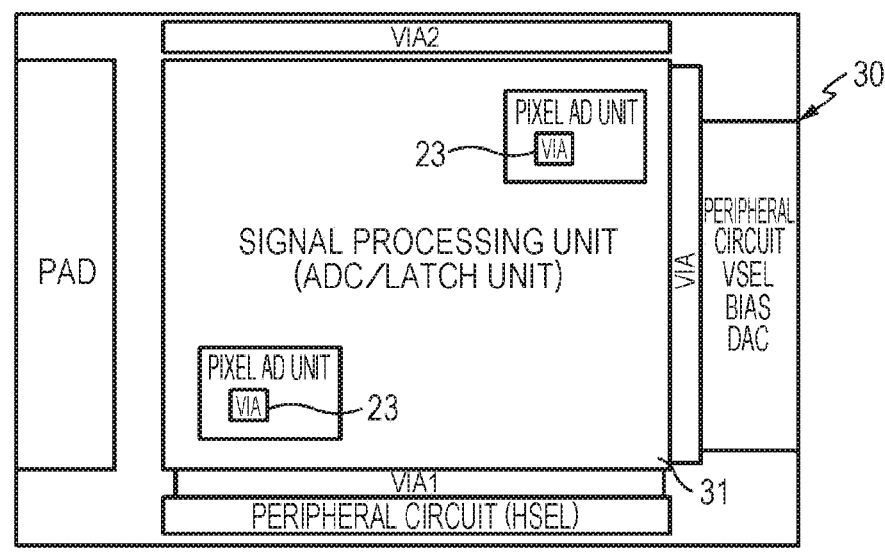
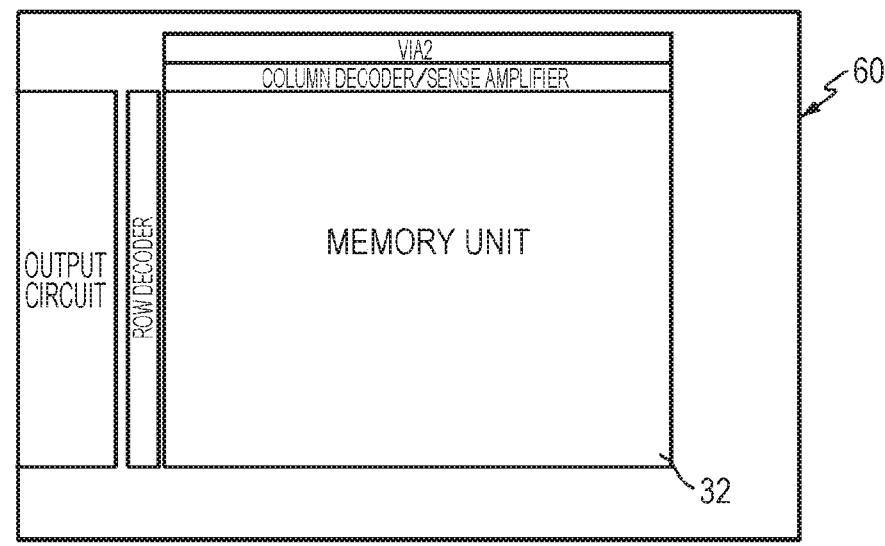

SOLID-STATE IMAGING DEVICE AND DRIVING METHOD OF SOLID-STATE IMAGING DEVICE, AND ELECTRONIC EQUIPMENT

CROSS REFERENCES TO RELATED APPLICATIONS

The present application is a Continuation of U.S. application Ser. No. 15/813,892, filed Nov. 15, 2017, which is a Continuation of U.S. application Ser. No. 15/443,092, filed Feb. 27, 2017, now U.S. Pat. No. 9,848,147, issued Dec. 19, 2017, which is a Continuation of U.S. application Ser. No. 14/405,045, filed Dec. 2, 2014, now U.S. Pat. No. 9,609,213, issued Mar. 28, 2017, which is a National Stage Entry of PCT/JP2013/065047, filed May 30, 2013, which claims priority to Japanese Patent Application JP 2012-282198, filed with the Japanese Patent Office on Dec. 26, 2012, and Japanese Patent Application JP 2012-152172, filed with the Japanese Patent Office on Jul. 6, 2012, the entire contents of which being incorporated herein by reference.

TECHNICAL FIELD

The present disclosure relates to a solid-state imaging device and a driving method of a solid-state imaging device, and electronic equipment.

BACKGROUND ART

In recent years, a solid-state imaging device, in particular, a CMOS (Complementary Metal Oxide Semiconductor) image sensor has been widely installed in electronic equipment such as a mobile phone, a digital still camera, a single-lens reflex camera, a camcorder, a surveillance camera, and the like by taking advantages of low power consumption and high-speed performance. Further, an image sensor having high performance and high image quality, in which even a functional circuit block such as a block for image processing is formed on a chip together with a pixel array unit (pixel unit), is also starting to appear, recently.

Conventionally, as a method of reading a signal from each pixel of a pixel array unit in a CMOS image sensor, there is a technique in which a non-volatile memory is provided in the latter stage of a signal processing unit which digitizes an analog pixel signal read from the pixel, to thereby realize high-speed reading using the non-volatile memory (for example, see Patent Document 1).

CITATION LIST

Patent Document

Patent Document 1: JP 2004-64410 A

SUMMARY OF THE INVENTION

Problems to be Solved by the Invention

In the conventional technique described above, after storing pixel data in a non-volatile memory, a data output unit which outputs (reads) pixel data from the non-volatile memory is caused to operate at a low speed slower than a transfer speed of the pixel data to the non-volatile memory to thereby realize low power consumption. However, in such a conventional technique, as low power consumption is realized only by low-speed operation of the data output unit, the effect of reducing power consumption is small.

As such, an object of the present disclosure is to provide a solid-state imaging device and a driving method of a solid-state imaging device capable of realizing readout of pixel data at a high speed with lower power consumption, and to provide electronic equipment having such a solid-state imaging device.

Solutions to Problems

A solid-state imaging device of the present disclosure, for achieving the object described above, is a solid-state imaging device, including:
  a signal processing unit including an AD converter that digitizes an analog pixel signal read from each pixel of a pixel array unit to a signal line, the signal processing unit transferring digitized pixel data at a first speed higher than a frame rate;
  a memory unit that stores the pixel data transferred from the signal processing unit;
  a data processing unit that reads pixel data at a second speed lower than the first speed from the memory unit; and
  a control unit that, when the pixel data is read from the memory unit, controls to stop operation of a current source connected with the signal line and operation of at least the AD converter of the signal processing unit.

Further, a driving method of a solid-state imaging device of the present disclosure, for achieving the object described above, is a driving method of a solid-state imaging device, the method including,
  in driving the solid-state imaging device including:
    a signal processing unit including an AD converter that digitizes a pixel signal read from each pixel of a pixel array unit to a signal line, the signal processing unit transferring digitized pixel data at a first speed higher than a frame rate;
    a memory unit that stores pixel data transferred from the signal processing unit; and
    a data processing unit that reads pixel data at a second speed lower than the first speed from the memory unit,
  when reading the pixel data from the memory unit, performing drive to stop operation of a current source connected with the signal line and operation of at least the AD converter of the signal processing unit.

By transferring pixel data from the signal processing unit to the memory unit at a first speed higher than the frame rate (so-called high-speed transfer), it is possible to realize high-speed readout which is faster than the frame rate. Further, by performing readout of pixel data from the memory unit at a second speed lower than the first speed (so-called low-speed readout), it is possible to realize lower power consumption by the operation speed being slowed. In addition, when reading pixel data from the memory unit, by performing so-called intermittent driving in which operation of the current source and operation of at least the AD converter of the signal processing unit are stopped, it is possible to reduce the power by the amount which would be consumed by the current source and the AD converter during the stopped period. As such, it is possible to further reduce the power consumption.

Effects of the Invention

According to the present disclosure, by using a memory unit and performing high-speed transfer with respect to the memory unit and low-speed readout due to intermittent driving, it is possible to realize high-speed readout of pixel data with lower power consumption.

BRIEF DESCRIPTION OF DRAWINGS

FIG. 8 is a layout diagram illustrating an exemplary layout of a layered chip in the case of adopting a configuration in which two systems each having an AD converter and circuitry associated therewith are provided.

FIG. 14 is a layout diagram illustrating an exemplary layout of a layered chip in the solid-state imaging device according to the second embodiment.

FIG. 18 is a layout diagram illustrating another exemplary layout of a layered chip in the solid-state imaging device according to the third embodiment.

MODE FOR CARRYING OUT THE INVENTION

Figure 1:
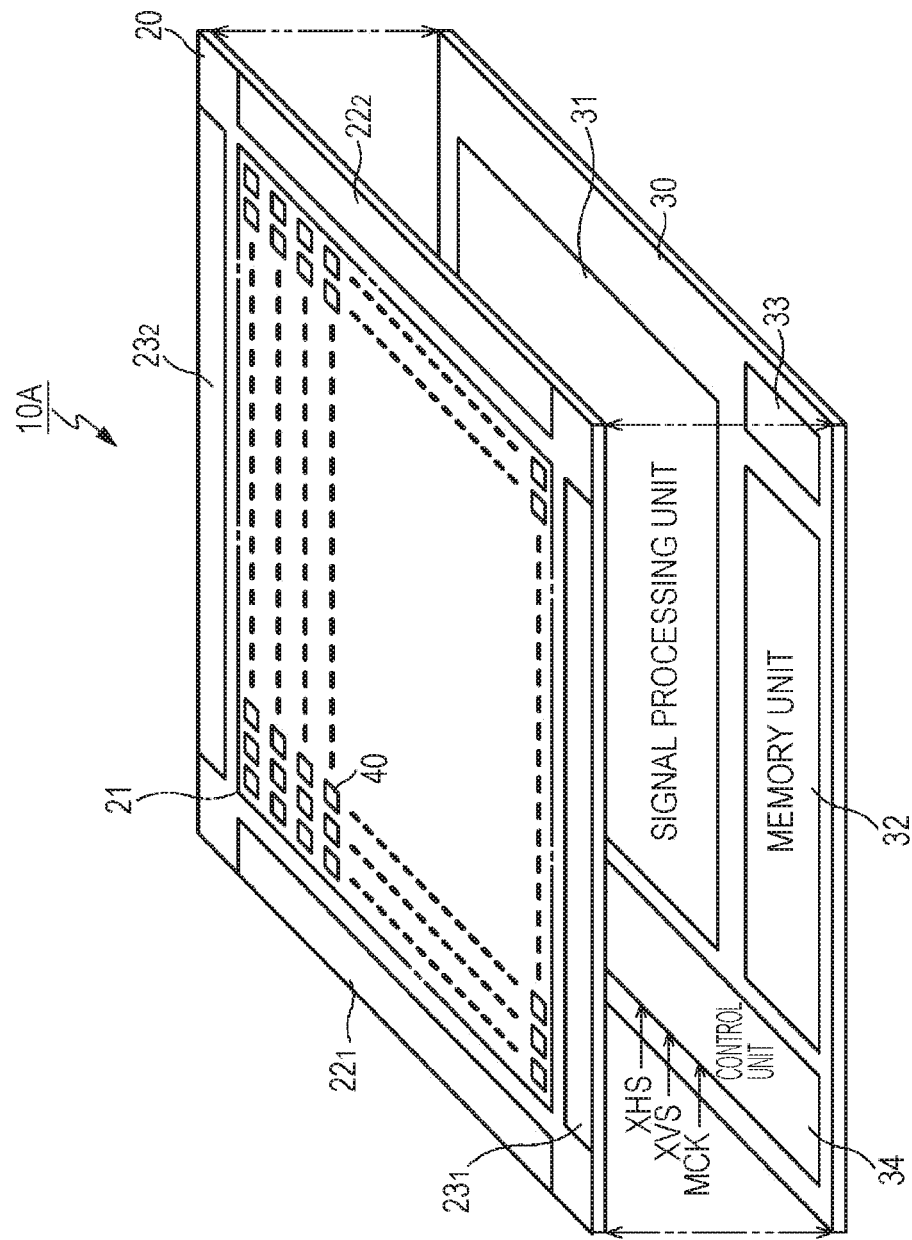
FIG. 1 is a schematic perspective view illustrating an exemplary configuration of a solid-state imaging device according to an embodiment of the present disclosure.

Hereinafter, modes for carrying out the present disclosure (hereinafter referred to as "embodiments") will be described in detail with use of the drawings. The present disclosure is not limited to the embodiments, and various numerical values in the embodiments are used for illustration purposes. In the following description, the same elements or elements having the same function are denoted by the same reference signs, and overlapping description is omitted. It should be noted that the description will be given in the following order.

1. General description of solid-state imaging device and driving method of solid-state imaging device, and electronic equipment, of present disclosure
2. Solid-state imaging device according to first embodiment (example of column-parallel AD conversion method)
   2-1. System configuration
   2-2. Circuit configuration
   2-3. Circuit operation
   2-4. Layout of layered chip
   2-5. Actions and advantageous effects of first embodiment
3. Solid-state imaging device according to second embodiment (example of pixel-parallel AD conversion method)
   3-1. System configuration
   3-2. Circuit configuration
   3-3. Circuit operation
   3-4. Layout of layered chip
   3-5. Actions and advantageous effects of second embodiment
4. Solid-state imaging device according to third embodiment (another example of pixel-parallel AD conversion method)
   4-1. System configuration
   4-2. Circuit configuration
   4-3. Circuit operation
   4-4. Layout of layered chip
   4-5. Actions and advantageous effects of third embodiment
5. Other exemplary configurations
6. Electronic equipment (example of imaging device)
7. Configuration of present disclosure

1. General Description of Solid-State Imaging Device and Driving Method of Solid-State Imaging Device, and Electronic Equipment, of Present Disclosure A solid-state imaging device of the present disclosure is configured to include, in addition to a pixel array unit, a signal processing unit, a memory unit, a data processing unit, and a control unit. The pixel array unit is formed such that unit pixels (hereinafter may be simply referred to as "pixels", including a photoelectric conversion element, are two-dimensionally arranged in a matrix. This means that the solid-state imaging device of the present disclosure is an X-Y address type solid-state imaging device capable of reading a pixel signal by a unit of one pixel, a unit of a plurality of pixels, or a unit of one or more rows (lines). As a typical X-Y address type solid-state imaging device, a CMOS image sensor can be exemplified.

In the pixel array unit, with respect to pixel arrays in a matrix, a control line (row control line) is wired on a per-pixel-row basis, and a signal line (column signal line/ vertical signal line) is wired on a per-pixel-column basis. Each signal line may be configured to be connected with the current source. With respect to the signal line, a signal (analog pixel signal) is read from each pixel of the pixel array unit. The readout may be configured to be performed under rolling shutter in which exposure is performed on a per-pixel or per-line (row) basis. The readout under the rolling shutter may be called rolling readout.

The signal processing unit includes an AD (analog-digital) converter which digitizes an analog pixel signal read from each pixel of the pixel array unit to the signal line, and may be configured to transfer image data, subjected to AD conversion, to the memory unit at a speed (first speed) higher than the frame rate (the number of images which can be imaged per second). In this way, by transferring pixel data to the memory unit at the first speed higher than the frame rate (high-speed transfer), it is possible to realize high-speed readout which is faster than the frame rate.

The memory unit is not limited particularly. The memory unit may be a non-volatile memory or a volatile memory. The data processing unit may be configured to read pixel data from the memory unit at a speed (second speed) slower than the first speed, that is, the transfer speed of the signal processing unit. In this way, by performing readout of pixel data at a speed lower than the first speed (low-speed readout), it is possible to realize low power consumption by the operation speed being lowered.

Further, it is possible to realize a configuration of performing intermittent driving in which when pixel data is read from the memory unit under control of the control unit, the pixel data is read while operation of the current source connected with the respective signal lines and operation of at least the AD converter of the signal processing unit are stopped. In this way, by performing intermittent driving in which operation of the current source and operation of the AD converter are stopped when pixel data is read from the memory unit, as it is possible to reduce the power by the amount which would be consumed by the current source and the AD converter during the stopped period, much lower power consumption can be realized.

With the above-described configuration, it is possible to realize a solid-state imaging device capable of performing high-speed readout of pixel data at lower power consumption. Such a solid-state imaging device, that is, the solid-state imaging device of the present disclosure, can be used as an imaging unit (image capturing unit) in electronic equipment such as a mobile terminal device having an imaging function such as a mobile telephone, a digital still camera, a single-lens reflex camera, a camcorder, a surveillance camera, or the like.

In the solid-state imaging device and the driving method thereof and the electronic equipment of the present disclosure including the preferable configuration described above, in the case of stopping operation of the current source and operation of the AD converter when pixel data is read from the memory unit, it is possible to take a mode of stopping them on a vertical synchronization signal basis. "Stop on a vertical synchronization signal basis" also means "stop in synchronization with a vertical synchronization signal.

Further, in the solid-state imaging device and the driving method thereof and the electronic equipment of the present disclosure including the preferable configuration described above, the signal processing unit, the memory unit, the data processing unit, and the control unit may be formed on at least one chip other than the chip on which the pixel array unit is formed, and a structure in which the chip on which the pixel array unit is formed and the other at least one chip are layered may be taken (so-called layered structure). In that case, the control unit may be configured to control the circuits on the side of the chip on which the pixel array unit is formed and the circuits on the side of the other at least one chip, in synchronization with each other.

In the solid-state imaging device and the driving method thereof and the electronic equipment of the present disclosure including the preferable configuration described above, the signal processing unit may be configured to perform signal processing in parallel (column parallel) in units of pixel columns with respect to analog pixel signals read by each pixel row from respective pixels of the pixel array unit.

Further, the signal processing unit may be configured to include the data latch unit and a parallel-serial conversion unit, and perform pipeline transfer of pixel data digitized by the AD converter to the memory unit. In that case, it is preferable to perform digitization processing by the AD converter within one horizontal period, and transfer digitized pixel data to the data latch unit within the next one horizontal period. Here, the data latch unit latches the pixel data digitized by the AD converter. Further, the parallel-serial conversion unit converts the pixel data, output from the data latch unit, from parallel data to serial data.

Alternatively, the signal processing unit may be configured to include the data latch unit, a data compression unit, and the parallel-serial conversion unit, and perform pipeline transfer of pixel data digitized by the AD converter to the memory unit. In that case, it is preferable to perform digitization processing by the AD converter within one horizontal period, and transfer digitized pixel data to the data latch unit within the next one horizontal period. Here, the data compression unit compresses the pixel data output from the data latch unit. Further, the parallel-serial conversion unit converts the pixel data, output from the data compression unit, from parallel data to serial data.

Further, in the solid-state imaging device and the driving method thereof and the electronic equipment of the present disclosure including the preferable configuration described above, the signal processing unit may be configured to include two or more AD converters and perform signal processing of digitization in parallel in the two or more AD converters. In that case, it is preferable to arrange the two or more AD converters separately on both sides in an extending direction of the signal line of the pixel array unit.

Further, in the solid-state imaging device and the driving method thereof and the electronic equipment of the present disclosure including the preferable configuration described above, the current source connected with the signal lines, the signal processing unit, and the memory unit may be configured to be provided for each unit consisting of a predetermined number of pixels. In that case, with respect to a pixel signal read by each unit consisting of a predetermined number of pixels from respective pixels of the pixel array unit, the signal processing unit may be in a mode to perform signal processing in parallel (pixel parallel) in such units, and preferably, to perform signal processing in a predetermined sequence on the pixels in the unit.

Further, in the solid-state imaging device and the driving method thereof and the electronic equipment of the present disclosure including the preferable configuration described above, the data processing unit may be configured to include a decoder which designates a column address to the memory unit, and a sense amplifier which reads pixel data of a designated address. In that case, it is possible to read pixel data from the memory unit through the sense amplifier and the decoder.

Further, in the solid-state imaging device and the driving method thereof and the electronic equipment of the present disclosure including the preferable configuration described above, the data processing unit may be configured to read pixel data from the memory unit during an exposure period.

Further, in the solid-state imaging device and the driving method thereof and the electronic equipment of the present disclosure including the preferable configuration described above, the control unit may be configured to cut a current path between the signal line and the current source when stopping the current source, connected with the signal line, on a vertical synchronization signal basis. In that regard, it is preferable to apply a fixed potential to the signal line.

2. Solid-State Imaging Device According to First Embodiment

FIG. 1 is a schematic perspective view illustrating an exemplary configuration of a solid-state imaging device according to a first embodiment of the present disclosure. Here, as a solid-state imaging device according to the first embodiment, a case of a CMOS image sensor will be described as an example. However, the present disclosure is not limited to application to a CMOS image sensor.

[2-1. System Configuration]

As illustrated in FIG. 1, a solid-state imaging device 10A according to the first embodiment includes a first chip (semiconductor substrate) 20 and a second chip 30 having a structure such that the first chip 20 serving as an upper-side chip and the second chip 30 serving as a lower-side chip are layered (so-called layered structure).

In the layered structure, the first chip 20 on the upper side is a pixel chip on which a pixel array unit (pixel unit) 21, configured of unit pixels 40 including a photoelectric conversion element which are two-dimensionally arranged in a matrix, is formed. On the periphery of the first chip 20, a pad $22_1$ and a pad $22_2$ for establishing an electrical connection with the outside, and a via $23_1$ and a via $23_2$ for establishing an electrical connection with the second chip 30 are provided.

While the present embodiment has a configuration in which the pad $22_1$ and the pad $22_2$ are provided on both left and right sides across the pixel array unit 21, it is possible to adopt a configuration in which they are provided on one of the left and right sides. Further, while the present embodiment has a configuration in which the via $23_1$ and the via $23_2$ are provided on both top and bottom sides across the pixel array unit 21, it is possible to adopt a configuration in which they are provided on one of the top and bottom sides. Further, it is also possible to adopt a configuration in which a pad is provided on the second chip 30 of the lower side and the first chip 20 is opened for bonding to the pad on the second chip 30 side, or a configuration in which a substrate is mounted by TSV (through silicon via) from the second chip 30.

It should be noted that a pixel signal obtained from each pixel 40 of the pixel array unit 21 is an analog signal, and the analog pixel signal is transmitted from the first chip 20 to the second chip 30 through the vias $23_1$ and $23_2$.

The second chip 30 on the lower side is a circuit chip on which in addition to a driving unit (not shown) for driving the respective pixels 40 of the pixel array unit 21 formed on the first chip 20, peripheral circuitry including a signal processing unit 31, a memory unit 32, a data processing unit 33, a control unit 34, and the like are formed.

The signal processing unit 31 performs predetermined signal processing including digitization (AD conversion) on an analog pixel signal read from each pixel 40 of the pixel array unit 21. The memory unit 32 stores pixel data on which predetermined signal processing is performed by the signal processing unit 31. The data processing unit 33 performs processing to read pixel data, stored in the memory unit 32, in a predetermined sequence, and output it to the outside of the chip.

The control unit 34 controls respective operations of the driving unit described above, and the peripheral circuitry such as the signal processing unit 31, the memory unit 32, and the data processing unit 33, based on a horizontal synchronization signal XHS, a vertical synchronization signal XVS, and a reference signal such as a master clock MCK, provided from the outside of the chip, for example. In that respect, the control unit 34 controls the circuit (pixel array unit 21) on the first chip 20 side and the circuits (the signal processing unit 31, the memory unit 32, and the data processing unit 33) on the second chip 30 side in synchronization with each other.

As described above, in the solid-state imaging device 10A configured of the layered first chip 20 and the second chip 30, as the first chip 20 only needs a size (area) on which the pixel array unit 21 can be formed, the size (area) of the first chip 20, and further, the size of the entire chip can be small. Moreover, as it is possible to apply a process suitable for creating the pixels 40 to the first chip 20 and a process suitable for creating circuits to the second chip 30, respectively, there is also an advantage that the processes can be optimized in manufacturing the solid-state imaging device 10A.

Further, while an analog pixel signal is transmitted from the first chip 20 side to the second chip 30 side, with the configuration in which circuitry for performing analog and digital processing are formed on the same substrate (second chip 30) and with the configuration in which the circuits on the first chip 20 side and the circuits on the second chip 30 side are controlled in synchronization with each other, it is possible to realize high-speed processing.

Incidentally, in the case of adopting a configuration of transmitting a pixel signal as digital data between different chips, a clock delay is caused due to an effect of parasitic capacity or the like, which prevents high-speed processing.

[2-2. Circuit Configuration]

Figure 2:
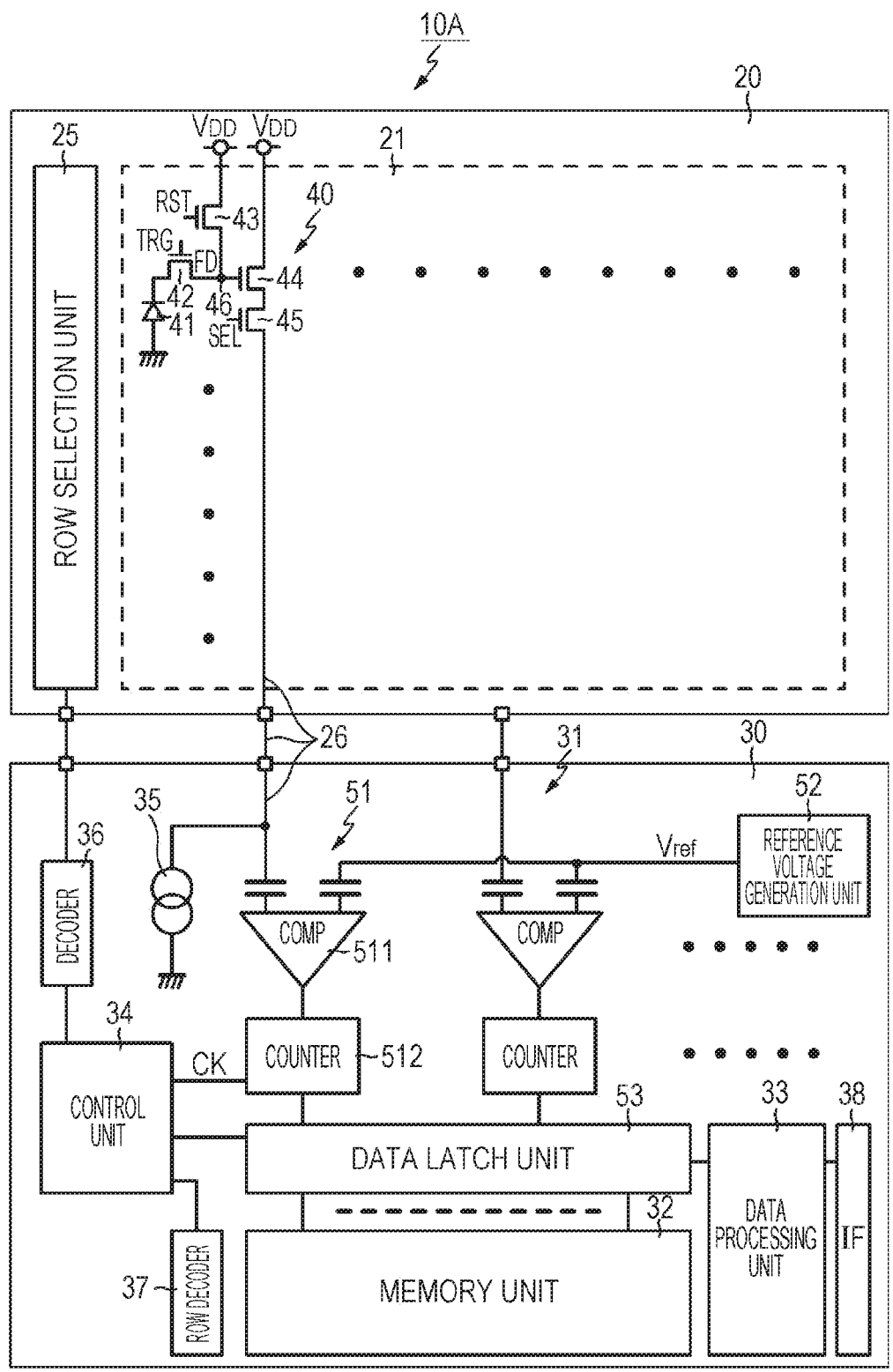
FIG. 2 is a circuit diagram illustrating a specific configuration of circuits on a first-chip side and circuits on a second-chip side in a solid-state imaging device according to a first embodiment.

FIG. 2 is a circuit diagram illustrating a specific configuration of the circuits on the first chip 20 side and the circuits on the second chip 30 side in the solid-state imaging device 10A according to the first embodiment. As described above, an electrical connection between the circuits on the first chip 20 side and the circuits on the second chip 30 side is made through the vias $23_1$ and $23_2$ illustrated in FIG. 1.

(Circuit Configuration on First Chip Side)

First, the circuit configuration on the first chip 20 side will be described using FIG. 2. On the first chip 20 side, in addition to the pixel array unit 21 configured of the unit pixels 20 arranged in a matrix, a row selection unit 25 is provided which selects respective pixels 40 of the pixel array unit 21 on a row basis, based on an address signal provided from the second chip 30 side. It should be noted that while the present embodiment adopts a configuration in which the row selection unit 25 is provided on the first chip 20 side, it is also possible to adopt a configuration in which it is provided on the second chip 30 side.

As illustrated in FIG. 2, the unit pixel 40 includes a photodiode 41, for example, as a photoelectric conversion element. In addition to the photodiode 41, the unit pixel 40 includes four transistors, namely a transfer transistor (transfer gate) 42, a reset transistor 43, an amplification transistor 44, and a selection transistor 45, for example.

In this embodiment, N-channel transistors are used as the four transistors 42 to 45, for example. However, a combination of the conductivity types of the transfer transistor 42, the reset transistor 43, the amplification transistor 44, and the selection transistor 45 exemplary illustrated herein is just an example, and it is not limited to this combination. This means that a combination using P-channel transistors may be used as needed.

To the unit pixel 40, a transfer signal TRG, a reset signal RST, and a selection signal SEL, which are driving signals for driving the pixel 40, are provided appropriately by the row selection unit 25 from time to time. This means that the transfer signal TRG is applied to a gate electrode of the transfer transistor 42, the reset signal RST is applied to a gate electrode of the reset transistor 43, and the selection signal SEL is applied to a gate electrode of the selection transistor 45, respectively.

The photodiode 41 is configured such that an anode electrode is connected with a low-potential side power source (for example, ground), and photoelectrically converts received light (incident light) into an optical charge (in this embodiment, photoelectron) having a charge amount corresponding to the amount of light, and accumulates the optical charge. A cathode electrode of the photodiode 41 is electrically connected with a gate electrode of the amplification transistor 44 via the transfer transistor 42. A node 46 electrically linked with the gate electrode of the amplification transistor 44 is called an FD (floating diffusion) unit.

The transfer transistor 42 is connected between the cathode electrode of the photodiode 41 and the FD unit 46. The gate electrode of the transfer transistor 42 is applied with a transfer signal TRG in which a high level (e.g., $V_{DD}$ level) is active (hereinafter referred to as "high active"), by the row selection unit 25. In response to the transfer signal TRG, the transfer transistor 42 becomes a conductive state, and transfers the optical charge subjected to photoelectric conversion by the photodiode 41, to the FD unit 46.

The reset transistor 43 is configured such that the drain electrode is connected with the pixel power source $V_{DD}$ and the source electrode is connected with the FD unit 46, respectively. The gate electrode of the reset transistor 43 is applied with a high-active reset signal RST by the row selection unit 25. In response to the reset signal RST, the reset transistor 43 becomes a conductive state, and discharges the charge of the FD unit 46 to the pixel power source $V_{DD}$ to thereby reset the FD unit 46.

The amplification transistor 44 is configured such that the gate electrode is connected with the FD unit 46, and the drain electrode is connected with the pixel power source $V_{DD}$, respectively. The amplification transistor 44 outputs the potential of the FD unit 46 after being reset by the reset transistor 43 as a reset signal (reset level) $V_{reset}$. Further, the amplification transistor 44 outputs the potential of the FD unit 46 after the signal charge has been transferred by the transfer transistor 42, as a light accumulation signal (signal level) $V_{sig}$.

The selection transistor 45 is configured such that the drain electrode is connected with the source electrode of the amplification transistor 44 and the source electrode is connected with the signal line 26, respectively, for example. The gate electrode of the selection transistor 45 is applied with a high-active selection signal SEL by the row selection unit 25. In response to the selection signal SEL, the selection transistor 45 becomes a conductive state, and causes the unit pixel 40 to be in a selected state and reads a signal output from the amplification transistor 44 onto the signal line 26.

As is clear from the above description, from the unit pixel 40, the potential of the FD unit 46 after the reset is read as a reset level $V_{reset}$, and then the potential of the FD unit 46 after the transfer of the signal charge is read to the signal line 26 as a signal level $V_{sig}$, sequentially. It should be noted that the signal level $V_{sig}$ includes the component of the reset level $V_{reset}$.

It should be noted that while the present embodiment has a circuit configuration in which the selection transistor 45 is connected between the source electrode of the amplification transistor 44 and the signal line 26, it is also possible to adopt a circuit configuration in which the selection transistor 45 is connected between the pixel power source $V_{DD}$ and the drain electrode of the amplification transistor 44.

Further, the unit pixel 40 is not limited to have a pixel configuration formed of the above-described four transistors. For example, a pixel configuration formed of three transistors in which the amplification transistor 44 has the function of the selection transistor 45, and a pixel configuration in which the transistors after the FD unit 46 are shared by the photoelectric conversion elements (by the pixels), may be used. Any configuration of the pixel circuit is acceptable.

(Circuit Configuration on Second Chip Side)

Next, a circuit configuration on the second chip 30 side will be described using FIG. 2. On the second chip 30 side, in addition to the signal processing unit 31, the memory unit 32, the data processing unit 33, and the control unit 34, described above, and a current source 35, a decoder 36, a row decoder 37, an interface (IF) unit 38, and the like are provided.

The current source 35 is connected with the respective signal lines 26 in which a signal is read on a pixel column basis from respective pixels 40 of the pixel array unit 21. The current source 35 has a configuration of a so-called load MOS circuit, which is formed of a MOS transistor in which a gate potential is biased to a constant potential so as to supply a constant current to the signal line 26. The current source 35 formed of the load MOS circuit supplies a constant current to the amplification transistor 44 of the unit pixel 40 in the selected row to thereby operate the amplification transistor 44 as a source follower.

The decoder 36 is configured such that when it selects respective pixels 40 of the pixel array unit 21 on a row basis, under control of the control unit 34, the decoder 36 provides the row selection unit 25 with an address signal designating the address of the selected row. The row decoder 37 designates a row address when it writes pixel data in the memory unit 32 or reads pixel data from the memory unit 32, under control of the control unit 34.

The signal processing unit 31 is configured to include at least an AD converter 51 which digitizes (performs AD conversion on) an analog pixel signal read thorough the signal line 26 from each pixel 40 of the pixel array unit 21, and perform signal processing (column-parallel AD) on the analog pixel signals in parallel on a pixel column basis.

The signal processing unit 31 further includes a reference voltage generation unit 52 which generates a reference voltage to be used in AD conversion by the AD converter 51. The reference voltage generation unit 52 generates a reference voltage of a so-called ramp waveform (inclined waveform) in which a voltage value varies stepwise as time elapses. The reference voltage generation unit 52 may be configured using a DAC (digital-analog conversion) circuit, for example.

The AD converter 51 is provided for each pixel column of the pixel array unit 21, that is, for each signal line 26, for example. This means that the AD converter 51 is formed as a so-called column-parallel AD converter in which the converters are arranged in the number of pixel columns of the pixel array unit 21. The AD converter 51 generates a pulse signal having a size (pulse width) in a time axis direction corresponding to the magnitude of the level of a pixel signal, for example, and performs processing of AD conversion by measuring the length of the period of the pulse width of the pulse signal.

More specifically, as illustrated in FIG. 2, the AD converter 51 is configured to include at least a comparator (COMP) 511 and a counter 512. The comparator 511 uses an analog pixel signal (the signal level $V_{sig}$ and the reset level $V_{reset}$ described above) read through the signal line 26 from each pixel 40 of the pixel array unit 21 as a comparison input, and uses reference voltage $V_{ref}$ of a lamp wave supplied from the reference voltage generation unit 52 as a reference input, and compares the both inputs.

Then, in the comparator 511, an output becomes a first state (high level, for example) when the reference voltage $V_{ref}$ is higher than the pixel signal, and an output becomes a second state (low level, for example) when the reference voltage $V_{ref}$ is not higher than the pixel signal. The output signal of the comparator 511 becomes a pulse signal having a pulse width corresponding to the magnitude of the level of the pixel signal.

As the counter 512, an up/down counter is used, for example. To the counter 512, a clock CK is supplied at the same time as a supply starting time of the reference voltage $V_{ref}$ to the comparator 511. The counter 512, which is an up/down counter, performs down count or up count in synchronization with the clock CK to thereby measure a period of a pulse width of an output pulse of the comparator 511, that is a comparison period from the start of the comparison operation to the end of the comparison operation. When performing the measurement operation, regarding the reset level $V_{reset}$ and the signal level $V_{sig}$ sequentially read from the unit pixel 40, the counter 512 performs down count on the reset level $V_{reset}$ and performs up count on the signal level $V_{sig}$.

Through the operation of down count/up count, a difference between the signal level $V_{sig}$ and the reset level $V_{reset}$ can be obtained. Consequently, in the AD converter 51, CDS (Correlated Double Sampling) processing is performed in addition to the AD conversion processing. Here, "CDS processing" is processing to remove fixed pattern noise unique to each pixel such as reset noise of the unit pixel 40, threshold variations in the amplification transistor 44, and the like, by obtaining a difference between the signal level $V_{sig}$ and the reset level $V_{reset}$. Then, a count result (count value) of the counter 512 becomes a digital value obtained by digitizing the analog pixel signal.

(Exemplary Configuration of Signal Processing Unit)

Figure 3:
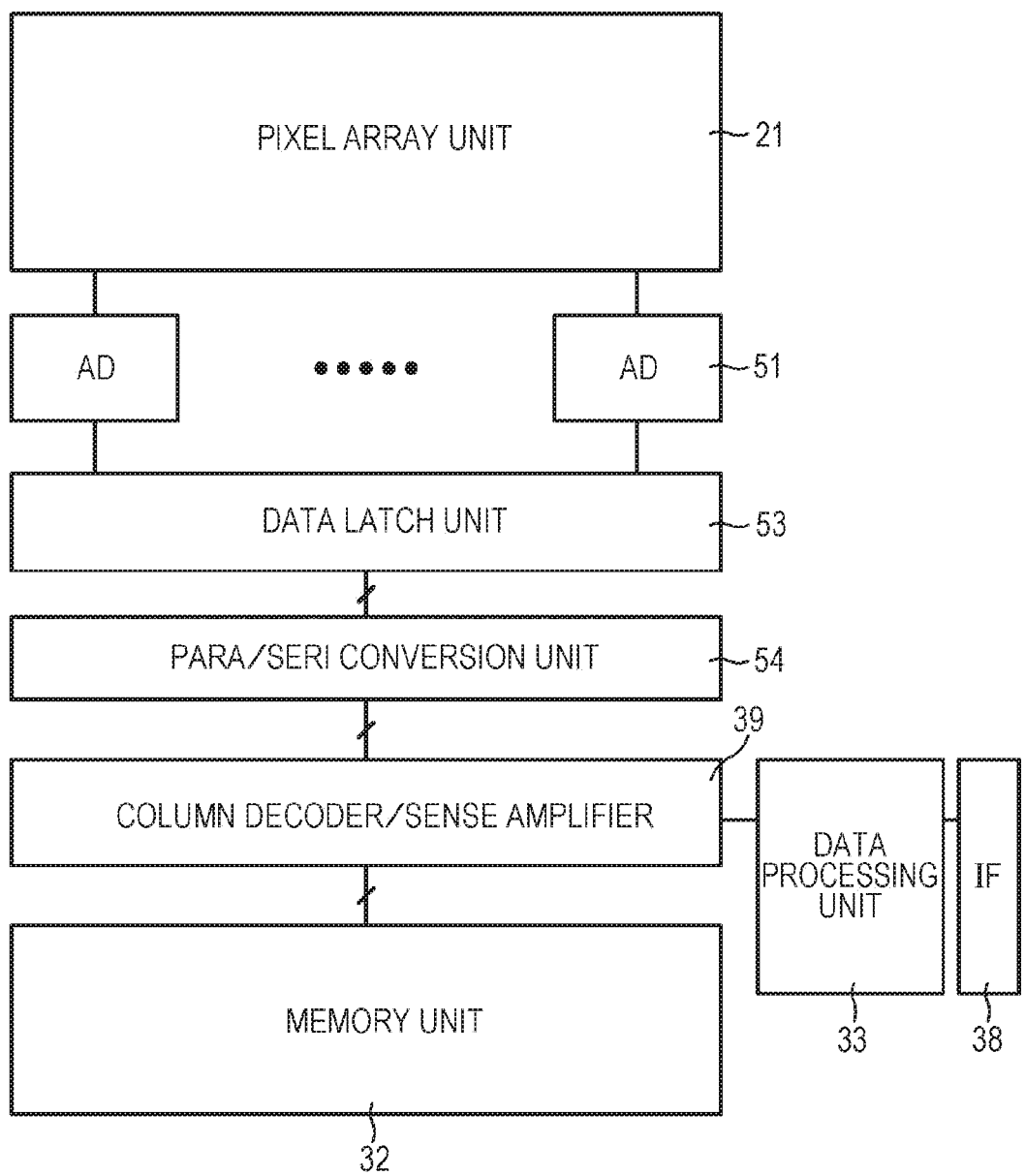
FIG. 3 is a block diagram illustrating an example of a specific configuration of a signal processing unit in the solid-state imaging device according to the first embodiment.

FIG. 3 is a block diagram illustrating an example of a specific configuration of the signal processing unit 31 in the solid-state imaging device 10A according to the first embodiment.

The signal processing unit 31 according to the present example includes a data latch unit 53 and a parallel-serial (hereinafter abbreviated to "para/seri") conversion unit 54, in addition to the AD converter 51, and has a pipeline configuration in which pixel data digitized by the AD converter 51 is transferred to the memory unit 32 by pipeline transfer. In that respect, the signal processing unit 31 performs digitization processing by the AD converter 51 within one horizontal period, and performs processing to transfer digitized pixel data to the data latch unit 53 within the next one horizontal period.

On the other hand, the memory unit 32 is equipped with a column decoder/sense amplifier 39 as a peripheral circuit thereof. While the above-described row decoder 37 (see FIG. 2) designates a row address to the memory unit 32, the column decoder designates a column address to the memory unit 32. Further, the sense amplifier amplifies a weak voltage read from the memory unit 32 through a bit line up to a level at which the voltage is able to be handled as a digital level. Then, the pixel data read through the column decoder/sense amplifier 39 is output to the outside of the second chip 30 through the data processing unit 33 and the interface unit 38.

It should be noted that while the present embodiment describes an example in which one column-parallel AD converter 51 is provided, the present disclosure is not limited to this. It is also possible to adopt a configuration in which two or more AD converters 51 are provided and digitization processing is performed in parallel in the two or more AD converters 51.

In that case, the two or more AD converters 51 will be arranged separately in an extending direction of the signal line 26 of the pixel array unit 21, that is, on both top and bottom sides of the pixel array unit 21. In the case where two or more AD converters 51 are provided, two (two systems) or more data latch units 53, para/seri conversion units 54, memory units 32, and the like will be provided, accordingly.

In the solid-state imaging device adopting a configuration having two systems of AD converters 51 and the like as described above, row scanning is performed by two pixel rows. A signal of each pixel in one pixel row is read to one side in an up and down direction of the pixel array unit 21, and a signal of each pixel on the other pixel row is read to the other side in the up and down direction of the pixel array unit 21, respectively, and the two AD converters 51 perform digitization in parallel. Subsequent signal processing is also performed in parallel. As a result, it is possible to realize high-speed reading of pixel data, compared with the case of performing row scanning by one pixel row.

[2-3. Circuit Operation]

Next, circuit operation of the solid-state imaging device 10A according to the first embodiment having the above-described configuration will be described using the timing chart of FIG. 4.

(Fast Readout)

First, by rolling readout performed under rolling shutter, a pixel signal is read at a high speed from each pixel 40 of the pixel array unit 21 on the first chip 20 side at a speed higher than a frame rate, that is, at a readout speed of 240 [fps], for example. The analog pixel signal read by the rolling readout is transmitted from the first chip 20 to the signal processing unit 31 on the second chip 30 side through the vias $23_1$ and $23_2$.

Next, in the signal processing unit 31, digitization of the analog pixel signal is performed by the AD converter 51. Then, the pixel data digitized by the AD converter 51 is transferred to the memory unit 32 by pipeline transfer, and stored in the memory unit 32. In this step, in the signal processing unit 3l, digitization processing by the AD converter 51 is performed within one horizontal period, and pipeline transfer to the memory unit 32 is performed within the next one horizontal period.

A speed of transferring the pixel data after the digitization processing to the memory unit 32 is a readout speed by the rolling readout, that is 240 [fps]. This means that the signal processing unit 31 transfers the pixel data, digitized by the AD converter 51, to the memory unit 32 at a speed (first speed) higher than the frame rate.

Meanwhile, in the rolling readout performed under the rolling shutter, distortion (hereinafter may be referred to as "rolling distortion") is caused because exposure timing in one screen differs by each pixel or by each line (row), as is well known.

In contrast, in the present embodiment, a pixel signal is read by high-speed readout at a speed higher than the frame rate from each of the unit pixels 40, and digitized pixel data is transferred at a high speed to the memory unit 32 at the first speed higher than the frame rate, and is stored. In this way, by temporarily storing the pixel data in the memory unit 32, synchronization of the pixel data can be made, whereby generation of rolling distortion can be prevented.

The pixel data stored in the memory unit 32 is read by the data processing unit 33 through the column decoder/sense amplifier 39 at a second speed which is lower than the first speed, that is, at a readout speed of 80 [fps], and outputs to the outside of the second chip 30 through the interface unit 38. In this way, by performing readout of the pixel data from the memory unit 32 at a second speed which is lower than the first speed (so-called low-speed readout), power consumption can be reduced by the operation speed being lowered.

Figure 4:
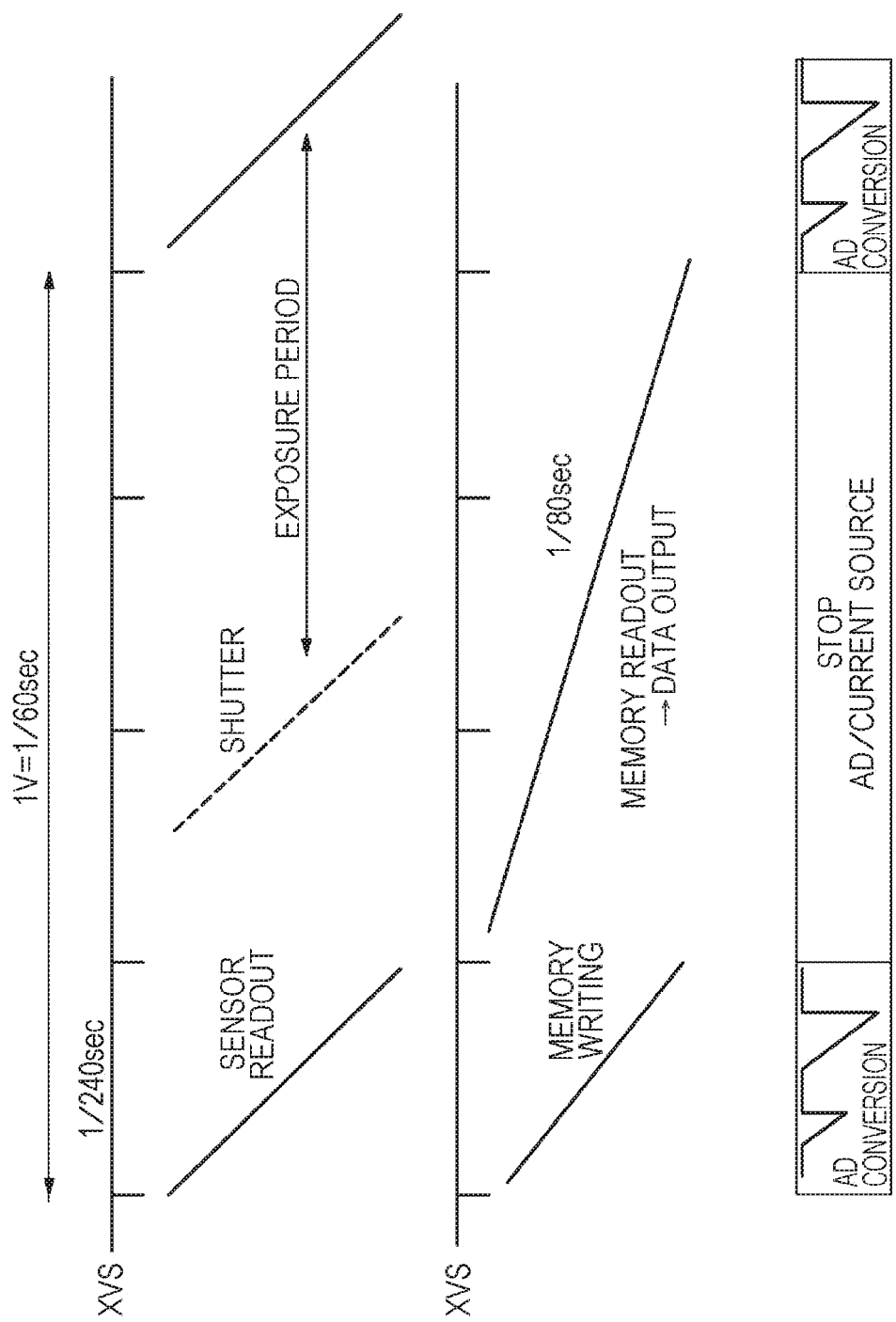
FIG. 4 is a timing chart for explaining circuit operation of the solid-state imaging device according to the first embodiment.

As obvious from the timing chart of FIG. 4, readout of pixel data from the memory unit 32 is performed during an exposure period. Incidentally, the conventional art described in Patent Document 1 adopts a configuration in which after pixel data is stored in the memory unit, the state becomes a standby state, and then image capturing is started. As such, images cannot be captured in real time. In contrast, as the present embodiment adopts a configuration in which readout of pixel data from the memory unit 32 is performed during an exposure period, it is possible to read pixel data of moving images and still images in real time.

Further, as the memory unit 32, various types of memories may be used whether non-volatile or volatile. For example, by performing processing from the start of writing pixel data to the memory unit 32 until completion of readout of pixel data by the data processing unit 33 at a speed higher than 20 [fps], there is no need to perform refresh operation for which a volatile memory (e.g., DRAM) requires about 50 [msec].

On the other hand, in a current CMOS image sensor, AD conversion and data output are performed by pipeline transfer at about several [psec]. The write speed of DRAM is similar or lower, that is, several [psec] or lower. Accordingly, it is possible to perform processing from readout of a pixel signal until writing of pixel data in the memory unit 32 by the pipeline configuration as illustrated in FIG. 3.

Specifically, digitization processing in the AD converter 51 is performed within one horizontal period (XHS), and the digital data is transferred to the data latch unit 53 within the next one horizontal period, and is stored in the data latch unit 53. Then, the para/seri conversion unit 54 converts it from a parallel signal to a serial signal, and the pixel data is written in the memory unit 32 under designation of a row address by the row decoder 37 and designation of a column address by the column decoder of the column decoder/sense amplifier 39. This means that the pixel data is subjected to AD conversion in parallel by the AD converter 51, and after being latched by the data latch unit 53, the data is written in the memory unit 32 in parallel, whereby pipeline transfer is realized. It should be noted that besides the configuration of performing pipeline transfer in which data can be written from the data latch unit 53 to the memory unit 32 within one horizontal period, it is also possible to adopt a method of pipeline transfer in which data is stored in the data latch unit 53, and in the next one horizontal period, writing into the memory and storing of digital data on the next row into the data latch unit 53 are performed.

(Standby During Frame Period)

In the aim of further reduction of power consumption, the present embodiment adopts a configuration in which when pixel data is read from the memory unit 32, operation of the current source 35 connected with the respective signal lines 26 and operation of at least the AD converter 51 of the signal processing unit 31 are stopped on a vertical synchronization signal XVS basis, for example. Here, "when pixel data is read from the memory unit 32" can also be said as after the pixel data is stored in the memory unit 32 at a high speed by pipeline transfer, or during the exposure period.

Incidentally, with the aim of reduction of power consumption, there is a conventional art in which power supply of an analog front-end circuit including an AD converter is allowed to fall during an image capturing (exposure) period so as to realize a standby state (see JP 2006-81048 A, for example). As the conventional art adopts a configuration in which a period from the end of readout of a pixel signal until the start of exposure takes a standby state, high-speed driving cannot be performed. Further, as the stopped period varies depending on the exposure time, suppression of power supply fluctuation and an effect in low power consumption are limited.

In contrast, in the present embodiment, as illustrated in the timing chart of FIG. 4, sensor operation in one frame (1V=⅙₀ [sec]) is performed in four vertical periods, where one vertical period (period between vertical synchronization signals XVS) takes 240 [fps], for example. Then, in three vertical periods after readout of a pixel signal, operation of the current source 35 used for readout of the pixel signal and operation of at least the AD converter 51 are stopped.

In this way, by stopping circuit operation in synchronization with the vertical synchronization signal XVS (on a vertical synchronization signal XVS basis) without depending on the exposure period, a power supply design is facilitated. Stop of the operation of the current source 35 and stop of the operation of at least the AD converter 51 of the signal processing unit 31 are performed under control by the control unit 34.

In the present embodiment, after high-speed rolling readout at 240 [fps], the unit pixel 40 is reset (shutter operation) to thereby start exposure. During the exposure period, it is possible to stop operation of the current source 35 and operation of the AD converter 51. Accordingly, by stopping operation of the current source 35 and operation of the AD converter 51 during the period from the start of readout of pixel data from the memory unit 32 of the current frame until the start of readout of a pixel signal from the unit pixel 40 of the next frame, it is possible to reduce power consumption by the amount which would be consumed by the current source 35 and the AD converter 51 during the stopped period.

Figure 5:
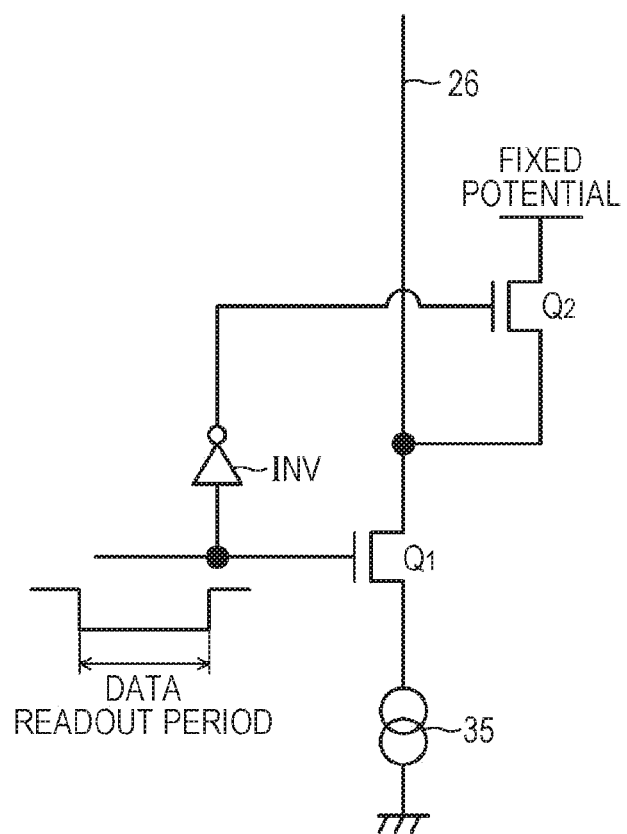
FIG. 5 is a circuit diagram illustrating an exemplary circuit configuration for interrupting (cutting) a current path between a signal line and a current source when operation of the current source is stopped.

The stop of operation of the current source 35 can be performed by interrupting (cutting) a current path between the signal line 26 and the current source 35, under control by the control unit 34. Specifically, as illustrated in FIG. 5, a transistor $Q_1$ is inserted between the signal line 26 and the current source 35, and the transistor $Q_1$ is caused to be in a non-conductive state by a low-level control signal whereby it is possible to stop operation of the current source 35.

Here, when stopping operation of the current source 35, it is preferable not only to interrupt a current path between the signal line 26 and the current source 35 but also to apply a fixed potential to the signal line 26. Specifically, as illustrated in FIG. 5, a transistor $Q_2$ is connected between the signal line 26 and the fixed potential, and the transistor $Q_2$ is caused to be in a conductive state by an inversion control signal of the above-described control signal via an inverter INV, whereby it is possible to apply the fixed potential to the signal line 26.

The grounds for applying the fixed potential to the signal line 26 when stopping operation of the current source 35, as described above, are to eliminate effects on the FD unit 46 of the unit pixel 40 caused by the signal line 26 becoming a floating state. This means that if the signal line 26 becomes a floating state and the potential of the signal line 26 fluctuates, for example, the fluctuation of the potential may change the potential of the FD unit 46 due to coupling by the parasitic capacitance of the amplification transistor 44. In order to eliminate such an effect on the FD unit 46, the fixed potential is applied to the signal line 26.

Further, depending on the setting of the exposure time, the shutter operation may extend over the first vertical period (1XVS) and the next vertical period (2XVS). In that case, it is preferable to perform control so as to stop the operation of the current source 35 after the shutter operation. By stopping the operation of the current source 35 after the shutter operation, it is possible to prevent effects of a standby operation of the current source 35, that is, fluctuations of the power supply potential and fluctuations of the potential of the signal line 26. It should be noted that if shutter start is in the next vertical period (2XVS) or later, there is no effect of a standby operation of the current source 35.

(Storing Data to Memory Unit and Outputting Data from Memory Unit)

Figure 6:
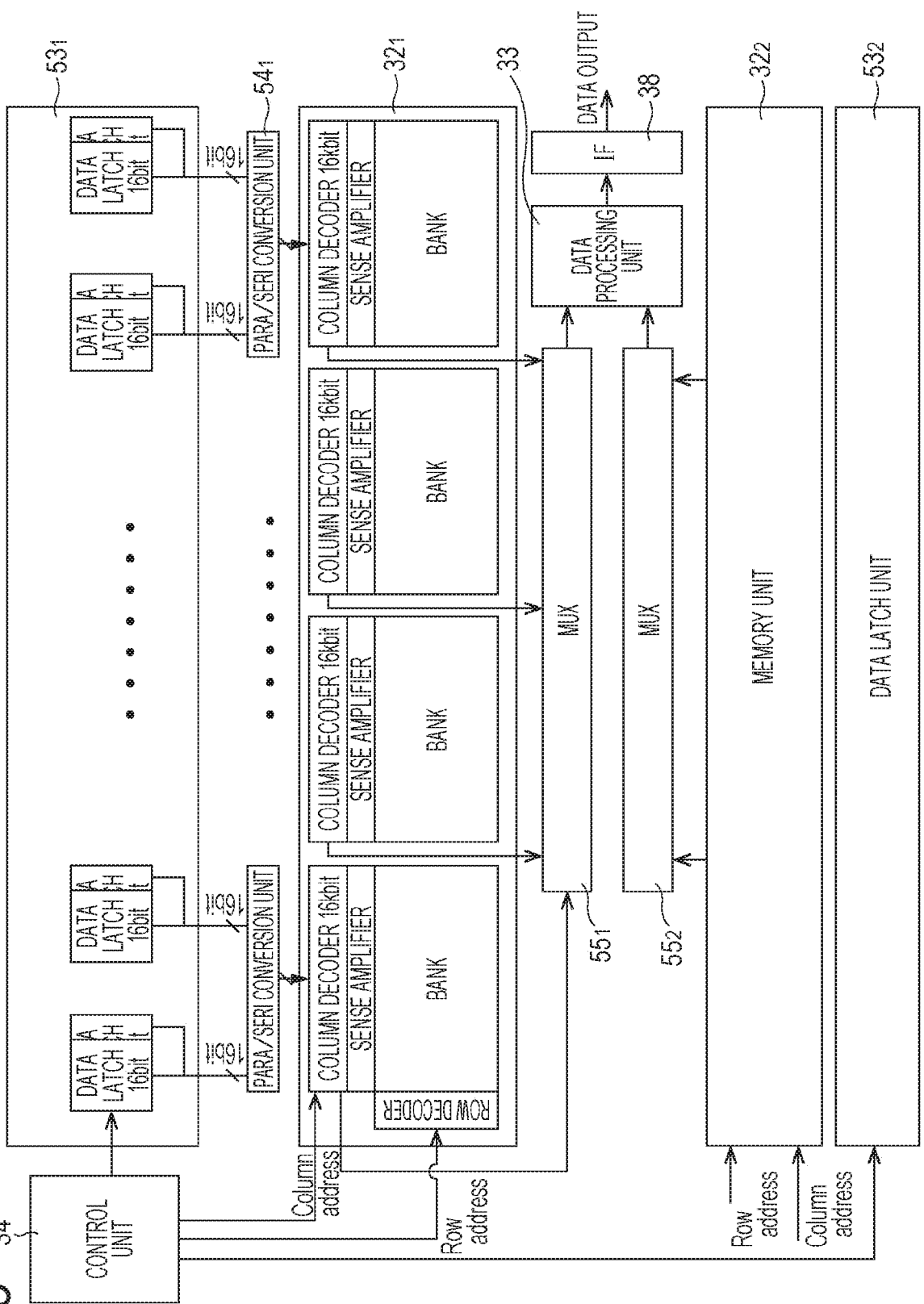
FIG. 6 is a block diagram for explaining an operation to store data from a data latch unit to a memory unit and output data from the memory unit.

Next, operation of storing data from the data latch unit 53 to the memory unit 32 and outputting data from the memory unit 32 will be described using FIG. 6. It should be noted that FIG. 6 illustrates an example of the case where AD converters 31 and the circuitry associated therewith, namely, circuitry such as the data latch units 53 ($53_1$, $53_2$) and the memory units 32 ($32_1$, $32_2$), are provided in two systems. However, this also applies to the case of one system, basically.

Pixel data after AD conversion is latched to the data latch unit 53. Regarding the latched data, 16-kbit data thereof is cached in the column decoder by the units of 128 lines, for example, by the para/seri conversion unit 54. Then, with use of the sense amplifier, the data is stored in the memory unit 32. In FIG. 6, while the memory unit 32 has a four-bank configuration, this is only an example. It is preferable to determine the number of banks so as to be able to store image data in units of horizontal pixels.

In the present embodiment, as a pipeline configuration is taken in which data is written on the bits of each memory unit in parallel with rolling readout, storing of data from the data latch unit 53 into the memory unit 32 can be completed in one vertical period. After completion of data writing into the memory unit 32, operation of the current source 35 and operation of the AD converter 51 are stopped as described above, and data readout from the memory unit 32 starts.

Regarding readout of data from the memory unit 32, in three vertical periods (in the present example, 80 [fps]) during the exposure period, the data is output from the interface unit 38 while rearrangement and synthesis of the data are performed by the multiplexers 55 ($55_1$, $55_2$) and the data processing unit 33. At the time of writing data to the memory unit 32, as data is not output from the memory unit 32, it is possible to reduce power consumption by an approach such that output of the interface unit 38 is fixed, for example. Specifically, it is possible to achieve low power consumption by stopping a clock given to the output section of the interface unit 38, for example.

(Another Exemplary Configuration of Signal Processing Unit)

Figure 7:
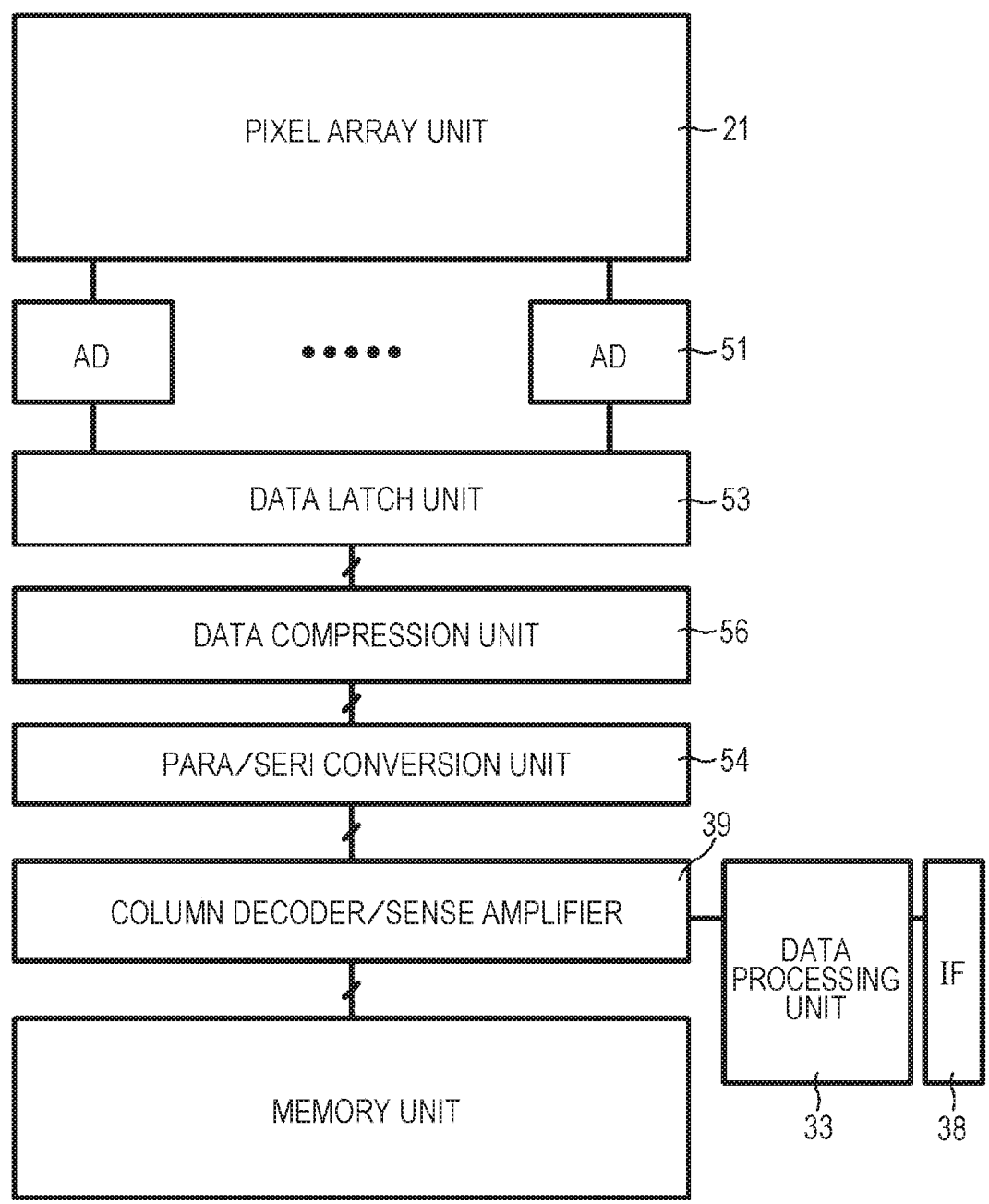
FIG. 7 is a block diagram illustrating another example of a specific configuration of a signal processing unit in the solid-state imaging device according to the first embodiment.

FIG. 7 is a block diagram illustrating another example of a specific configuration of the signal processing unit in the solid-state imaging device according to the first embodiment.

The signal processing unit 31 according to the present example includes a data compression unit 56 in addition to the AD converter 51, the data latch unit 53, and the para/seri conversion unit 54, and has a pipeline configuration in which pixel data digitized by the AD converter 51 is transferred to the memory unit 32 by pipeline transfer. In that respect, the signal processing unit 31 performs digitization processing by the AD converter 51 within one horizontal period, and transfers the digitized pixel data to the data latch unit 53 within the next one horizontal period.

The data compression unit 56 is provided between the data latch unit 53 and the para/seri conversion unit 54, for example, compresses pixel data output from the data latch unit 53, and supplies it to the para/seri conversion unit 54. As a compression method used by the data compression unit 56, DPCM (differential pulse-code modulation) can be exemplary shown, for example.

In this way, by providing the data compression unit 56 between the data latch unit 53 and the memory unit 32, and storing data in the memory unit 32 after compressing the data by the data compression unit 56, the memory capacity of the memory unit 32 can be reduced. Due to the capacity reduction of the memory unit 32, it is possible to reduce the layout area of the second chip 30 on which the signal processing unit 31 is mounted.

[2-4. Layout of Layered Chip]

Here, consideration will be given on a layout of a layered chip adopting a configuration in which a plurality of systems, for example, two systems each having the AD converter 51 and the circuitry associated therewith are provided, as described above, and signal processing is performed on signals of respective pixels in two pixel rows in parallel, that is, a layout of a chip formed of the first chip 20 and the second chip 30 which are layered.

In the case of adopting a configuration in which two systems each including the AD converter 51 and the circuitry associated therewith are provided, for example, signals of respective pixels on two pixel rows are read to both sides in an extending direction of the signal line 26 of the pixel array unit 21, that is, on both up and down sides of the pixel array unit 21.

Incidentally, in the case of adopting a configuration in which a memory unit is arranged on the same substrate (chip) as the pixel array unit as in the conventional art described in Patent Document 1, along with arrangement of AD converters and the like on top and bottom of the pixel array unit, it is also necessary to divide memory units on top and bottom. In that case, as a layout distance of the output unit of the memory unit, a distance of about (size in up and down direction of the pixel array unit+size in up and down direction of the memory unit) is required, and as the layout arrangement of the data output unit is in another configuration, the chip size will become large. Further, in a clock synchronization scheme such as LVDS (low voltage differential signaling), it is necessary to include a clock of another system, which leads to an increase in the number of channels of a signal processing chip.

In contrast, the present embodiment adopts a configuration of a layered chip including the first chip 20 on which the pixel array unit 21 is formed, and the second chip 30 on which the signal processing unit 31 including the AD converter 51, the memory unit 32, the data processing unit 33, and the control unit 34 are formed, which are layered. Thereby, as illustrated in FIG. 8, along with the AD converters $51_1$ and $51_2$ being arranged on both up and down sides of the second chip 30 (which may also be said as on both up and down sides of the pixel array unit 21), the memory units $32_1$ and $32_2$ can be arranged adjacent to each other between the AD converters $51_1$ and $51_2$.

In this way, as the memory units $32_1$ and $32_2$ can be arranged adjacent to each other, the data output unit (data output path) of the memory units $32_1$ and $32_2$ can be configured collectively. Thereby, as data can be output through the same output unit, only one set of clock synchronization signals are needed. As such, it is possible to prevent an increase in the number of channels of the signal processing chip in the latter stage. Incidentally, the control unit 34 will be provided in a free space such as a space between the memory unit $32_1$ and the memory unit $32_2$.

While, in the above-described layout example, description has been given on the case of adopting a configuration in which two systems each having the AD converter 51 and the circuitry associated therewith are provided, this also applies to the case of adopting a configuration in which three or more systems are provided so as to increase the rate of parallel readout of pixel signals from the pixel array unit 21. For example, an exemplary layout in the case of adopting a configuration in which four systems each having the AD converter 51 and the circuitry associated therewith will be described below.

Figure 9:
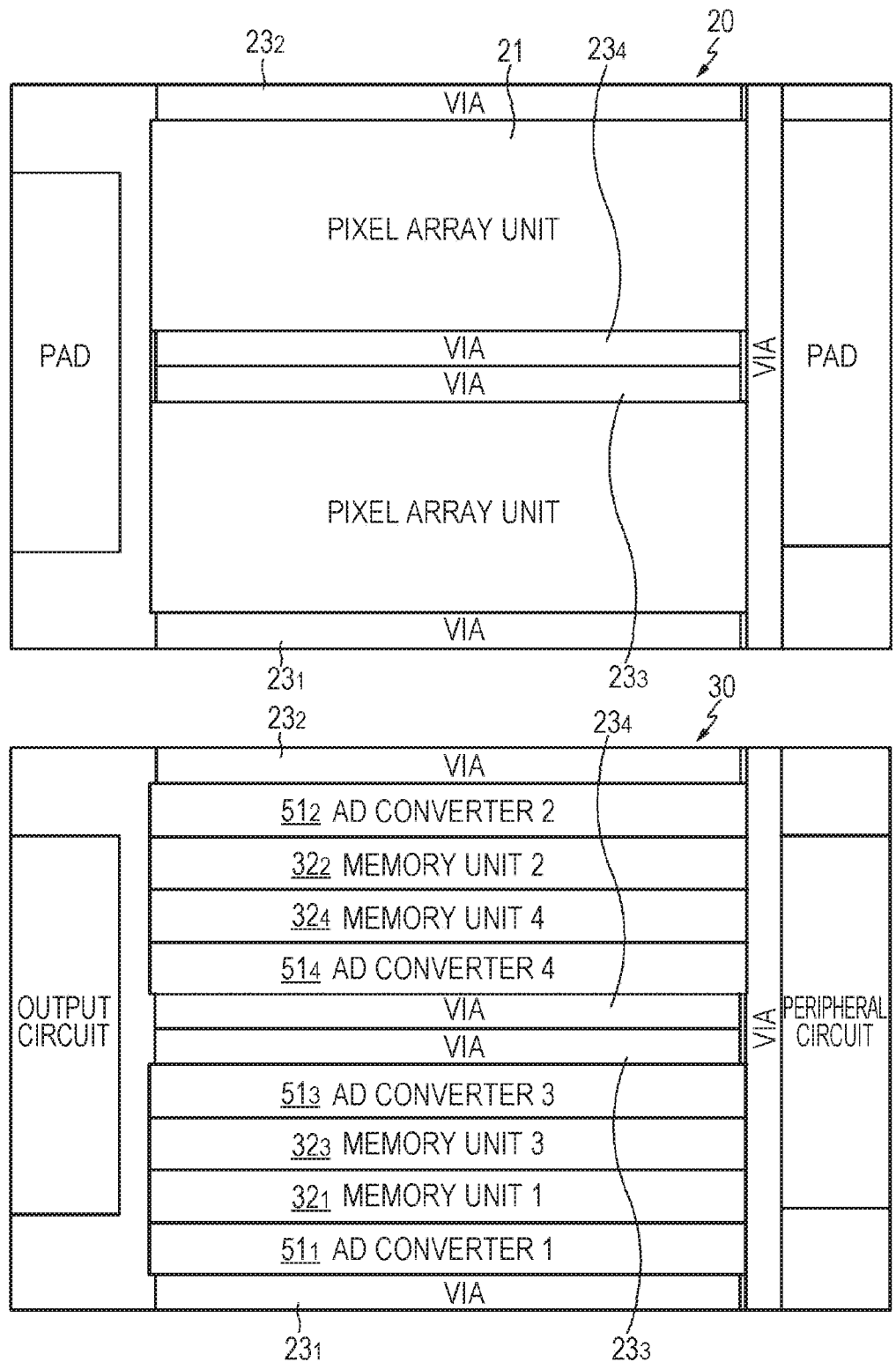
FIG. 9 is a layout diagram illustrating an exemplary layout 1 of a layered chip in the case of adopting a configuration in which four systems each having an AD converter and circuitry associated therewith are provided.

FIG. 9 is a layout diagram illustrating an exemplary layout 1 of a layered chip in the case of adopting a configuration in which four systems each having the AD converter 51 and the circuitry associated therewith are provided. In the present exemplary layout 1, two systems of vias are provided in the center portion in an up and down direction of the pixel array unit 21, and signals of the respective pixels on four pixel rows are simultaneously read to the second chip 30 side, through the two systems of vias $23_1$ and $23_2$ on both up and down sides of the pixel array unit 21 and two systems of vias $23_3$ and $23_4$ in the center portion.

On the second chip 30 side, four AD converters $51_1$ to $51_4$ are arranged in the vicinity of the respective vias $23_1$ to $23_4$. Further, the memory units $32_1$ and $32_3$ are arranged between the AD converter $51_1$ and the AD converter $51_3$, and the memory units $32_2$ and $32_4$ are arranged between the AD converters $51_2$ and the AD converter $51_4$, adjacent to each other. In this way, even in the case of adopting a configuration in which four systems each having the AD converter 51 and the circuitry associated therewith are provided, the memory units $32_1$ and $32_3$ and the memory units $32_2$ and $32_4$ can be arranged adjacent to each other. Consequently, even in the present exemplary layout 1, actions and effects which are the same as those in the case of the exemplary layout of FIG. 8 can be achieved.

Figure 10:
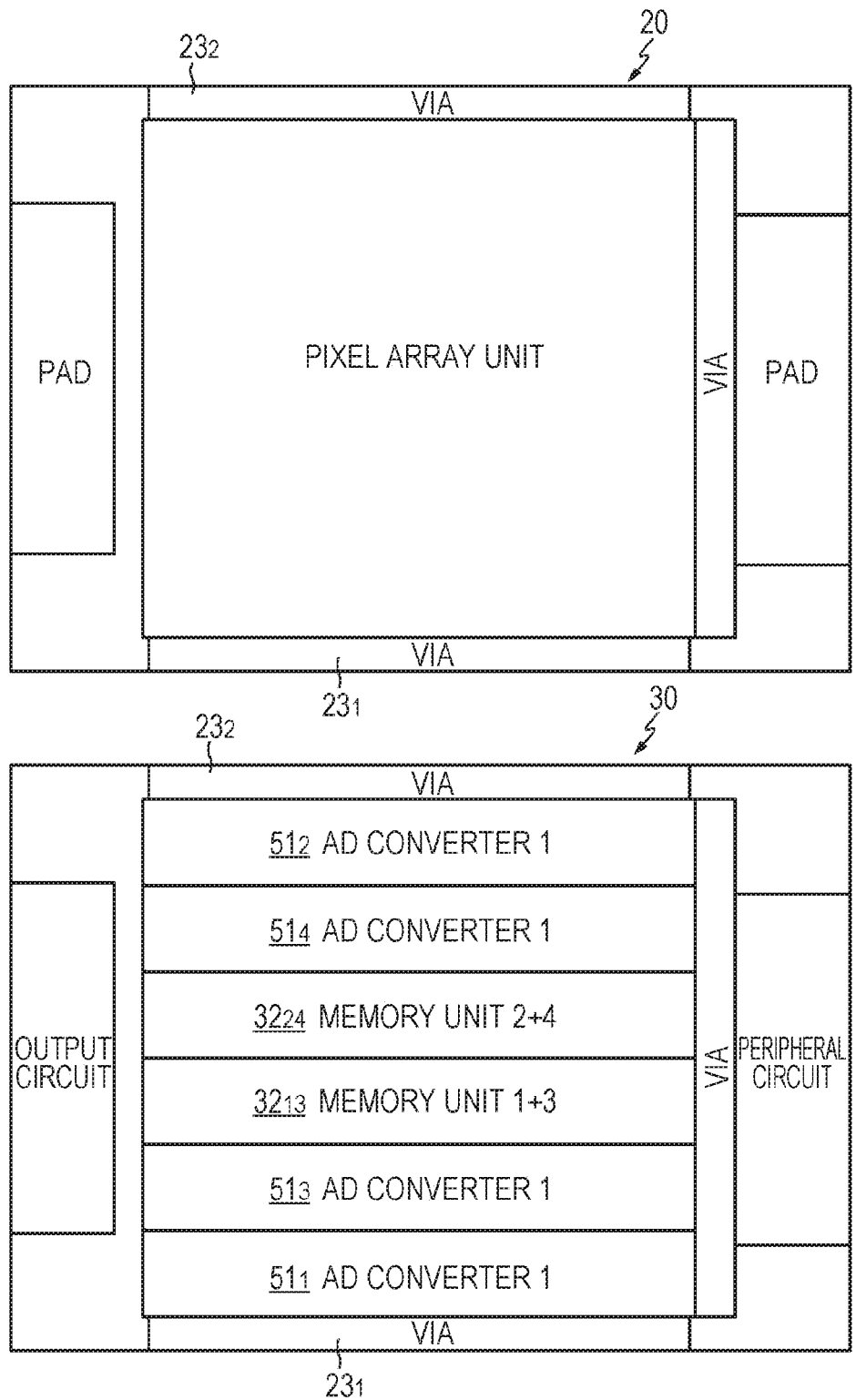
FIG. 10 is a layout diagram illustrating an exemplary layout 2 of a layered chip in the case of adopting a configuration in which four systems each having an AD converter and circuitry associated therewith are provided.

FIG. 10 is a layout diagram illustrating an exemplary layout 2 of a layered chip in the case of adopting a configuration in which four systems each having the AD converter 51 and the circuitry associated therewith are provided. The present exemplary layout 2 has a configuration in which two systems of vias $23_1$ and $23_2$ are provided on both up and down sides of the pixel array unit 21, which is the same as the exemplary layout of FIG. 8.

On the second chip 30 side, the two AD converters $51_1$ and $51_3$ are arranged adjacent to each other near one via $23_1$, and the two AD converters $51_2$ and $51_4$ are arranged adjacent to each other near the other via $23_2$. Between the AD converter $51_3$ and the AD converter $51_4$, a memory unit $32_{13}$, corresponding to the AD converters $51_1$ and $51_3$, and a memory unit $32_{24}$, corresponding to the AD converters $51_2$ and $51_4$, are arranged adjacent to each other. Even in the case of the present exemplary layout 2, the memory unit $32_{13}$ and the memory unit $32_{24}$ can be arranged adjacent to each other. Consequently, even in the present exemplary layout 2, actions and effects which are the same as those in the case of the exemplary layout of FIG. 8 can be achieved.

[2-5. Actions and Advantageous Effects of First Embodiment]

According to the solid-state imaging device 10A according to the first embodiment described above, the following actions and effects can be achieved. That is, by providing the memory unit 32, and at the time of high-speed transfer to the memory unit 32 and readout of pixel data from the memory unit 32, performing low-speed readout by intermittent driving in which operation of the current source 35 and operation of the AD converter 51 are stopped, it is possible to realize high-speed readout of pixel data with lower power consumption. Further, in the signal processing unit 31, by stopping not only operation of the AD converter 51 but also operation of the other circuitry, power consumption can be reduced further.

Further, by allowing the readout speed by the data processing unit 33, that is, data output rate, to be lower than the transfer speed of the pixel data to the memory unit 32, reduction of the channels of the interface unit 38 and lower processing speed of the signal processing block (for example, DSP) in the latter stage can be realized. This can contribute to low power consumption of the entire system including the signal processing block in the latter stage.

Further, as the first chip 20 and the second chip 30 are connected so as to form a laminated chip and the circuits on the first chip 20 side and the circuits on the second chip 30 side are synchronized with each other under control by the control unit 34, as data after an AD conversion can be transferred to the memory unit 32 by pipeline transfer, synchronous design is facilitated.

Further, as pixel data is read from the memory unit 32 during the exposure period, pixel data of moving image and still images can be read in real time, compared with the conventional art adopting a configuration in which after pixel data is stored in a memory unit, the state becomes a standby state and then image capturing starts. Accordingly, real-time image capturing can be performed.

Further, in the case of adopting a configuration in which the data compression unit 56 is provided between the data latch unit 53 and the memory unit 32, and data is compressed by the data compression unit 56 and then stored in the memory unit 32, the memory capacity of the memory unit 32 can be reduced, whereby the layout area of the second chip 30 can be reduced.

Further, by providing two or more systems each having the AD converter 51 and the circuitry associated therewith and data after AD conversion is transferred to the memory unit 32 by pipeline transfer, there is an advantage that rolling distortion can be further improved.

3. Solid-State Imaging Device According to Second Embodiment

Next, a solid-state imaging device according to a second embodiment of the present disclosure will be described.

Even in this embodiment, a case of a CMOS image sensor will be exemplary described as a solid-state imaging device of the second embodiment, which is the same as the first embodiment. However, the present embodiment is not limited to application to a CMOS image sensor.

[3-1. System Configuration]

Similar to the solid-state imaging device according to the first embodiment, the solid-state imaging device according to the second embodiment has a layered structure in which the first chip 20 and the second chip 30 are layered. The device is configured such that on the first chip 20 side, a pixel array unit (pixel unit) 21 is formed, and on the second chip 30 side, circuitry such as the signal processing unit 31 including the AD converter 51, the memory unit 32, the data processing unit 33, and the control unit 34 are formed.

[3-2. Circuit Configuration]

Figure 11:
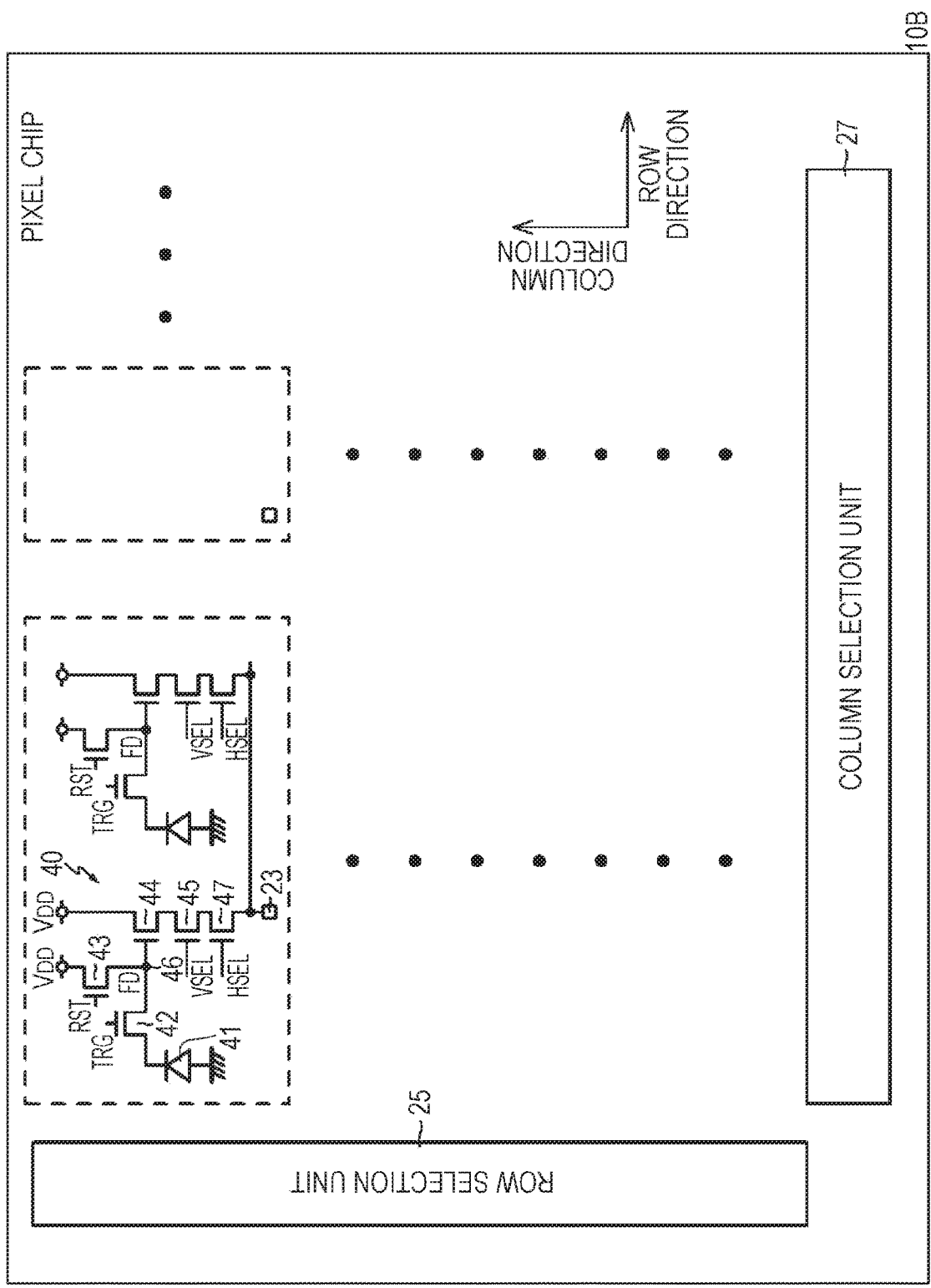
FIG. 11 is a circuit diagram illustrating a specific configuration of circuits on a first chip side in a solid-state imaging device according to a second embodiment.
Figure 12:
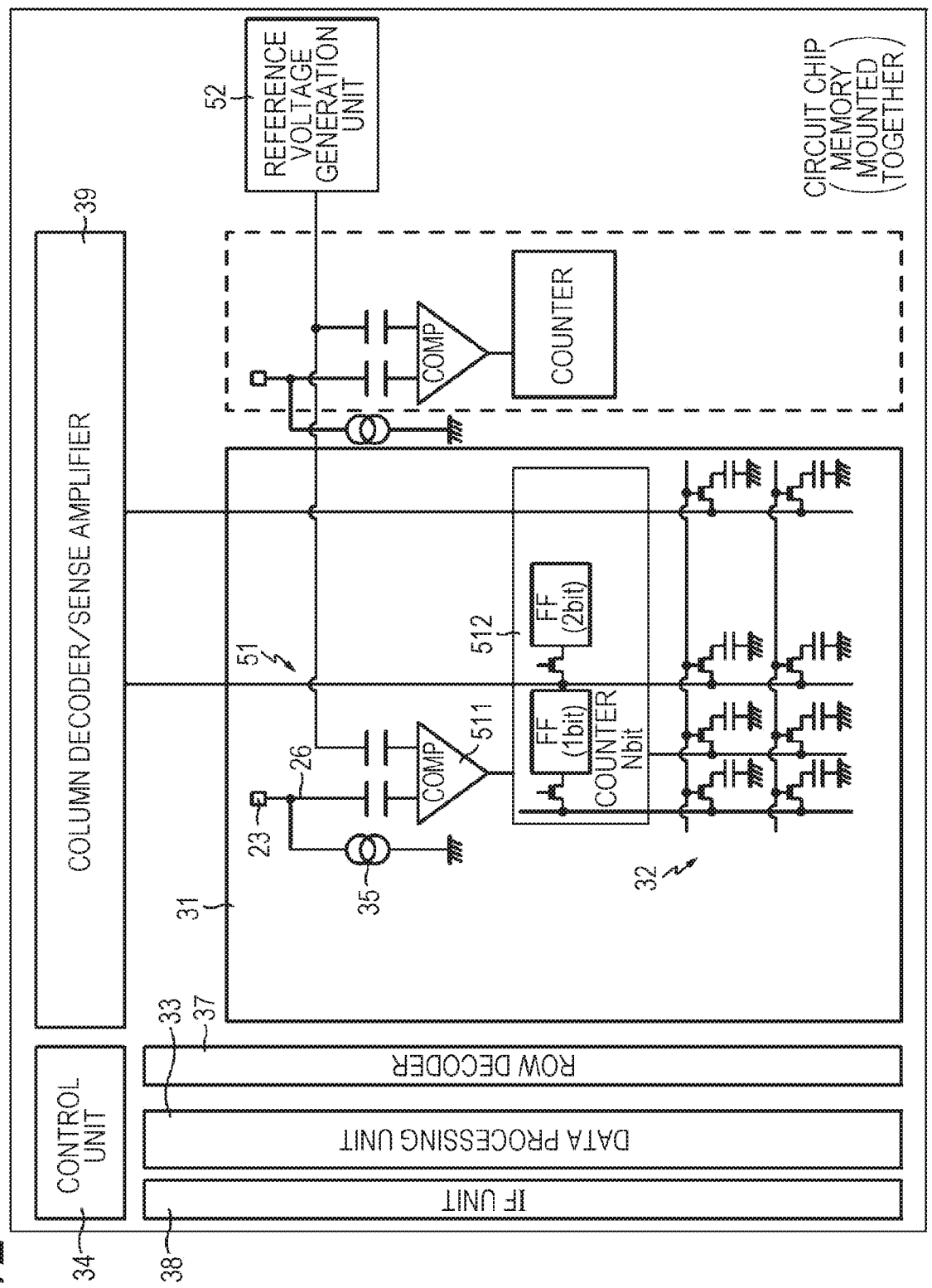
FIG. 12 is a circuit diagram illustrating a specific configuration of circuits on a second chip side in the solid-state imaging device according to the second embodiment.

FIG. 11 is a circuit diagram illustrating a specific configuration of the circuits on the first chip side in the solid-state imaging device of the second embodiment, and FIG. 12 is a circuit diagram illustrating a specific configuration of the circuits on the second chip side in the solid-state imaging device of the second embodiment.

A solid-state imaging device 10B according to the present embodiment adopts a configuration of grouping a predetermined number of pixels 40 of the pixel array unit 21 (as a unit), reading pixel signals from the respective pixels 40 on a group basis, and performs signal processing including AD conversion in parallel on the read pixel signals in units of groups. This means that while the solid-state imaging device 10A according to the first embodiment uses a column-parallel AD conversion method in which AD conversion is performed on pixel signals on a pixel column basis, the solid-state imaging device 10B according to the second embodiment uses a pixel-parallel AD conversion method in which AD conversion is performed in parallel on a group basis having a predetermined number of pixels.

When grouping a predetermined number of pixels (in one unit), it is considered to group a plurality of pixels adjacent to each other belonging to the same pixel row in one unit, group a plurality of pixel adjacent in up and down and left and right in one unit, or the like, for example. Further, it is not limited to the configuration of reading pixel signals by each group consisting of a plurality of pixels. Ultimately, it is possible to adopt a configuration of reading an individual pixel signal as a unit.

In the configuration of the present embodiment, the vias 23 for connecting the pixel array unit 21 on the first chip 20 side and the signal processing unit 31 on the second chip 30 side are required on a group basis or a pixel basis. The vias 23 allowing an electrical connection between the chips can be realized by a well-known inter-wiring bonding technique. The pixel signals read on a group basis or a pixel basis are transmitted from the first chip 20 side to the second chip 30 side through the vias 23 provided on a group basis or a pixel basis.

(Circuit Configuration on First Chip Side)

As a configuration of pixel-parallel AD conversion is adopted, on the first chip 20 side, a column selection unit 27 is provided besides the pixel array unit 21 and the row selection unit 25, as illustrated in FIG. 11. The column selection unit 27 selects respective pixels 40 of the pixel array unit 21 on a group basis (or a pixel basis) in an array direction (row direction) of the pixel column, based on an address signal provided from the second chip 30 side. It should be noted that while the present embodiment adopts a configuration in which the row selection unit 25 and the column selection unit 27 are provided on the first chip 20 side, it is possible to adopt a configuration in which they are provided on the second chip 30 side.

Further, the unit pixel 40 is configured to include two selection transistors 45 and 47, in addition to the transfer transistor 42, the reset transistor 43, and the amplification transistor 44. The two selection transistors 45 and 47 are connected in series with respect to the amplification transistor 44. One selection transistor 45 is driven by a row selection signal VSEL provided by the row selection unit 25. The other selection transistor 47 is driven by a column selection signal HSEL provided by the column selection unit 27.

It should be noted that selection scanning is performed on a group basis under driving by the row selection unit 25 and the column selection unit 27, and signals of a plurality of pixel in a group are transferred to the second chip 30 side through one via 23. As such, pixel signals are read in a predetermined sequence from the pixels in the group. Then, on the second chip 30 side, signal processing is performed on the analog pixel signals read by each group consisting of a predetermined number of pixels, in a predetermined sequence of the pixels in the group (readout sequence of pixel signals).

(Circuit Configuration of Second Chip Side)

Corresponding to the configuration in which a predetermined number of unit pixels 40 are grouped as a unit and the via 23 is provided for each group, the signal line 26 leading to the via 23 is wired on the second chip 30 as illustrated in FIG. 12. The signal line 26 is connected with the current source 35, and is also connected with the AD converter 51, and further, the memory unit 32.

As such, the signal processing unit 31 including the signal line 26, the current source 35, the AD converter 51, the memory unit 32, and the like, is provided by the group consisting of a predetermined number of pixels. As the memory unit 32, a DRAM may be exemplary shown, but it is not limited thereto. As such, the memory unit 32 may be a volatile memory or a non-volatile memory, which is the same as the case of the first embodiment.

In the solid-state imaging device 10A according to the first embodiment adopting a column-parallel AD conversion method as described above, AD conversion is performed during a horizontal period (XHS) and data is output. In order to read data at a higher frame rate, it is necessary to increase the number of pixels on which AD conversion is performed simultaneously. In order to increase the number of pixels on which AD conversion is performed simultaneously, pixel-parallel AD conversion processing (in units of pixels), rather than column parallel, is required.

If the readout speed can be faster by pixel-parallel AD conversion, as the stopped period of the AD converter 51 can be longer by that amount, it is possible to further reduce power consumption. As an example, if sensor readout (readout of pixel signals) is performed at a readout speed of 960 [fps] and data output from the memory unit 32 is performed at a speed of 64 [fps], it is possible to reduce the operation period of the AD converter 51 to one tenth or shorter of the data output period.

[3-3. Circuit Operation]

Figure 13:
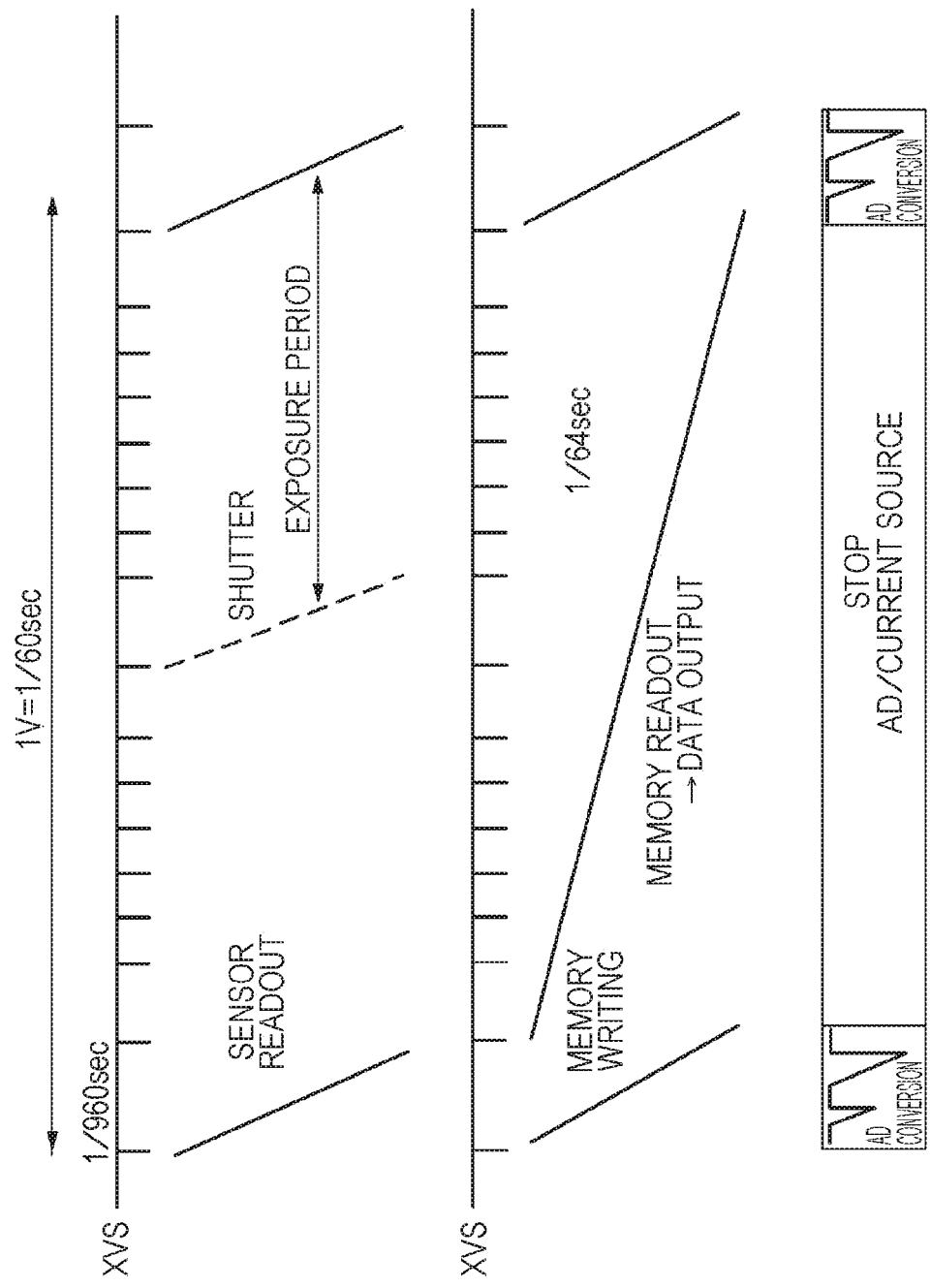
FIG. 13 is a timing chart for explaining circuit operation of the solid-state imaging device according to the second embodiment.

Next, circuit operation of the solid-state imaging device 10B according to the second embodiment having the above-described configuration will be described using the timing chart of FIG. 13.

In order to read pixel signals at a readout speed of 960 [fps], it is assumed that about 250 pixels, that is, 16*16 pixels, of the pixels 40 of the pixel array unit 21 form one unit (group). Assuming that the AD conversion time by the AD converter 51 is 4 [psec], it is possible to read pixel signals of 250 pixels in the time of 1 [msec] or shorter. However, the numerical values exemplary shown herein are examples, and are not limited.

A pixel unit (group) consisting of 16*16 pixels is selected by address designation by a row selection signal VSEL provided from the row selection unit 25 and a column selection signal HSEL provided from the column selection unit 27. Then, an analog pixel signal read from one pixel in the pixel unit selected by the row selection signal VSEL and the column selection signal HSEL is subjected to AD conversion by the AD converter 51.

At the time of AD conversion, CDS processing is performed by down count with respect to a reset level $V_{reset}$ and up count with respect to a signal level $V_{sig}$ in the counter 512. The pixel data after the CDS processing is written into the memory unit 32 under designation of a row address by the row decoder 37 and designation of a column address by the column decoder of the column decoder/sense amplifier 39.

The row selection unit 25 and the column selection unit 27 perform selection scanning on a pixel unit (group) basis, while with respect to the pixels in the selected pixel unit, performing selection scanning on pixels in parallel in a predetermined sequence on a pixel unit basis. As selection of pixels in a pixel unit, selection by means of a raster scan method can be shown as an example.

Then, with respect to the remaining pixels in the pixel unit, pixel selection and AD conversion are performed by means of a raster scan method by the row selection signal VSEL and the column selection signal HSEL, and the pixel data after the CDS processing is stored in the memory unit 32. Regarding the data stored in the memory unit 32, it is possible to output (read) the data at a low speed by performing readout through the column decoder/sense amplifier 39.

Then, as in the case of the solid-state imaging device 10A according to the first embodiment, when reading pixel data from the memory unit 32, control to stop operation of the current source 35 and operation of at least the AD converter 51 of the signal processing unit 31 is performed. Here, as a pixel-parallel AD conversion method is adopted in the solid-state imaging device 10B according to the present embodiment, readout speed of pixel signals can be faster. Thereby, as the stopped period of the AD converter 51 can be taken longer, it is possible to realize lower power consumption.

[3-4. Layout of Layered Chip]

FIG. 14 is a layout diagram illustrating an exemplary layout of a laminated chip in the solid-state imaging device 10B according to the second embodiment.

As illustrated in FIG. 14, in the first chip 20, the pixel array unit 21 is configured such that pixel units (groups), in which a predetermined number of pixels form one unit, are two-dimensionally arranged in a matrix, and a via 23 is formed for each pixel unit. On the other hand, in the second chip 30, the signal processing unit 31 is configured such that circuitry including the AD converter 51, the memory unit 32, and the like (in the drawing, pixel AD unit) is provided corresponding to the pixel unit of the pixel array unit 21, and the via 23 is formed corresponding to the pixel unit by the pixel AD unit.

It should be noted while FIG. 11 exemplary illustrates the case of adopting a configuration in which the row selection unit 25 and the column selection unit 27 are provided on the first chip 20 side, it is possible to adopt a configuration in which they are provided as peripheral circuitry (HSEL, VSEL) on the second chip 30 side, as illustrated in the exemplary layout of FIG. 14. If such a configuration is adopted, there is an advantage that a larger area of the first chip 20 can be used as a region for the pixel array unit 21.

[3-5. Actions and Advantageous Effects of Second Embodiment]

According to the solid-state imaging device 10B according to the second embodiment described above, in addition to the above-described actions and advantageous effects of the solid-state imaging device 10A of the first embodiment, the following actions and advantageous effects can be achieved. That is, as readout speed of pixel signals can be faster by using a pixel-parallel AD conversion method, it is possible to take a longer stopped period of the AD converter 51. Accordingly, it is possible to further reduce the power consumption compared with the case of the solid-state imaging device 10A according to the first embodiment using a column-parallel AD conversion method.

4. Solid-State Imaging Device According to Third Embodiment

Next, a solid-state imaging device according to a third embodiment of the present disclosure will be described. Even in this embodiment, a case of a CMOS image sensor will be exemplary described as a solid-state imaging device of the third embodiment, which is the same as the first embodiment and the second embodiment. However, the present embodiment is not limited to application to a CMOS image sensor.

[4-1. System Configuration]

Similar to the solid-state imaging devices according to the first and second embodiments, the solid-state imaging device according to the third embodiment has a layered structure in which the first chip 20 and the second chip 30 are layered. The device is configured such that on the first chip 20 side, the pixel array unit (pixel unit) 21 is formed, and on the second chip 30 side, circuitry such as the signal processing unit 31 including the AD converter 51, the memory unit 32, the data processing unit 33, and the control unit 34 are formed.

[4-2. Circuit Configuration]

Figure 15:
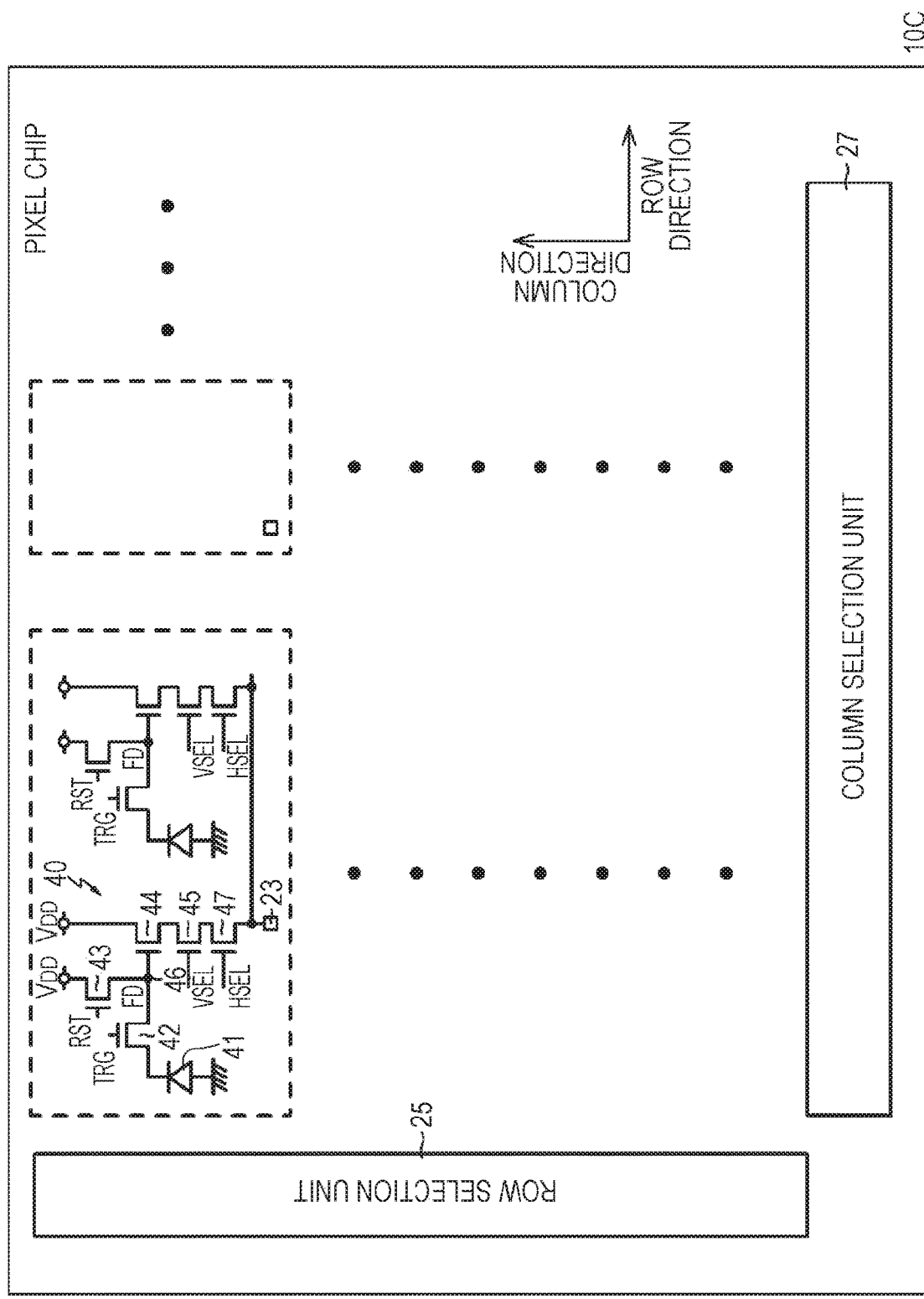
FIG. 15 is a circuit diagram illustrating a specific configuration of circuits on a first chip side in a solid-state imaging device according to a third embodiment.
Figure 16:
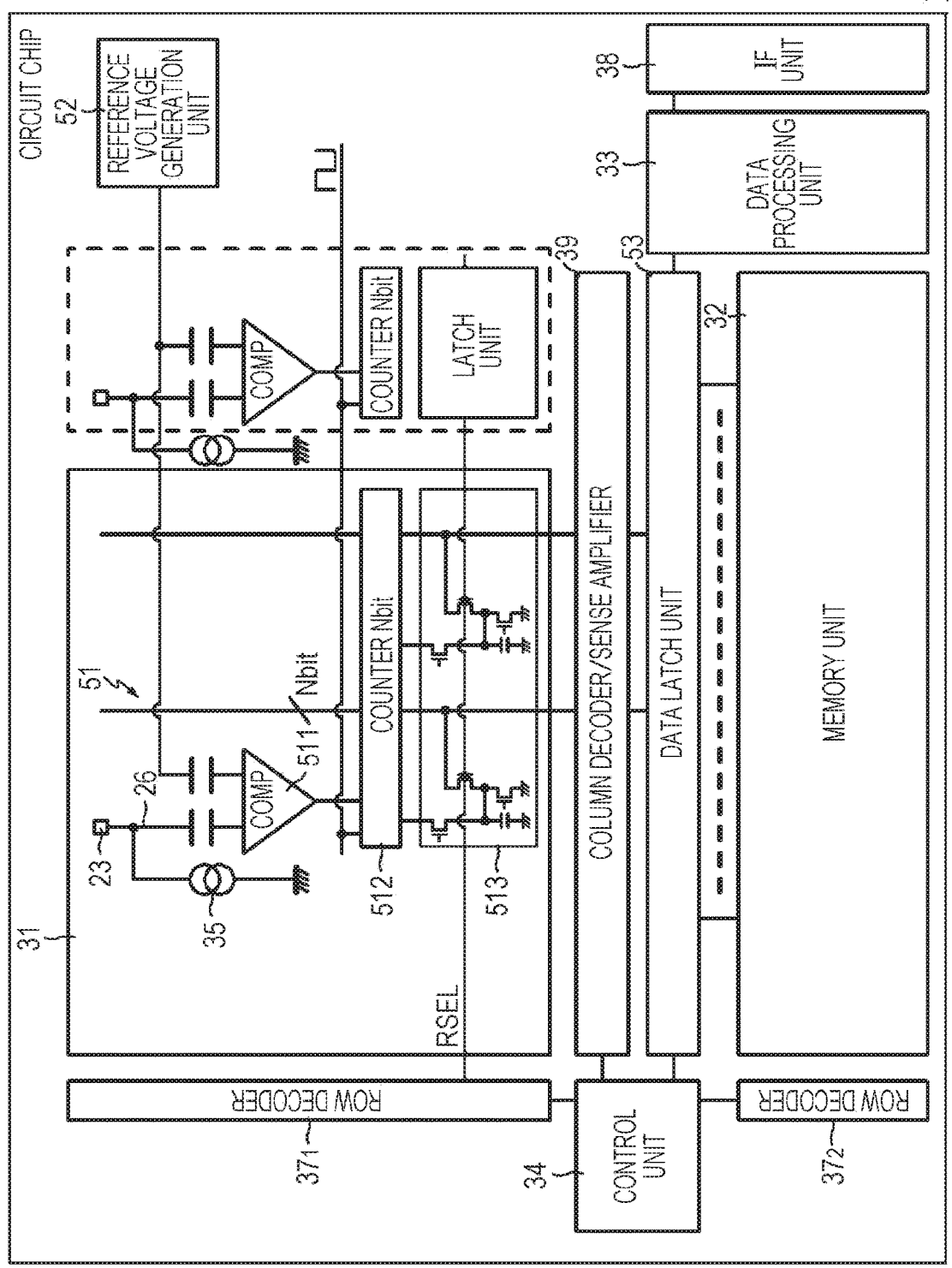
FIG. 16 is a circuit diagram illustrating a specific configuration of circuits on a second chip side in the solid-state imaging device according to the third embodiment.

FIG. 15 is a circuit diagram illustrating a specific configuration of the circuits on the first chip side in the solid-state imaging device of the third embodiment, and FIG. 16 is a circuit diagram illustrating a specific configuration of the circuits on the second chip side in the solid-state imaging device of the third embodiment.

Similar to the solid-state imaging device 10B according to the second embodiment, a solid-state imaging device 10C according to the present embodiment also adopts a pixel-parallel AD conversion method. As such, the solid-state imaging device 10C according to the present embodiment has a configuration of grouping a predetermined number of pixels 40 of the pixel array unit 21, reading pixel signals from the respective pixels 40 by the group, and performs signal processing including AD conversion in parallel on the read pixel signals in units of groups.

However, the solid-state imaging device 10C according to the present embodiment differs from the solid-state imaging device 10B according to the second embodiment in the following aspects. That is, the solid-state imaging device 10B according to the second embodiment adopts a configuration in which the memory unit 32 is provided along with the AD converter 51 in the signal processing unit 31, that is, a configuration in which both the AD converter 51 and the memory unit 32 are mounted together. In contrast, the solid-state imaging device 10C according to the present embodiment adopts a configuration in which the memory unit 32 is provided outside the signal processing unit 31.

When grouping the unit pixels 40 in which a predetermined number of pixels forms one unit, it is considered to group a plurality of pixels adjacent to each other belonging to the same pixel row in one unit, group a plurality of pixel adjacent in up and down and left and right in one unit, or the like, for example, which is the same as the case of the second embodiment. Further, the present embodiment is not limited to have the configuration of reading pixel signals by each group consisting of a plurality of pixels. Ultimately, it is possible to adopt a configuration of reading an individual pixel signal as a unit.

Even in the configuration of the present embodiment, the vias 23 for connecting the pixel array unit 21 on the first chip 20 side and the signal processing unit 31 on the second chip 30 side are required on a group basis or a pixel basis. The vias 23 allowing an electrical connection between the chips can be realized by a well-known inter-wiring bonding technique. The pixel signals read on a group basis or a pixel basis are transmitted from the first chip 20 side to the second chip 30 side through the vias 23 provided on a group basis or a pixel basis.

(Circuit Configuration on First Chip Side)

The configuration on the first chip 20 side is basically similar to that of the second embodiment. That is, as a configuration of pixel-parallel AD conversion is adopted, on the first chip 20 side, a column selection unit 27 is provided which selects the respective pixels 40 of the pixel array unit 21 in units of groups (or in units of pixels) in a row direction, besides the pixel array unit 21 and the row selection unit 25, as illustrated in FIG. 15. It should be noted that it is possible to adopt a configuration in which the row selection unit 25 and the column selection unit 27 are provided on the second chip 30 side.

(Circuit Configuration on Second Chip Side)

Corresponding to the configuration in which a predetermined number of unit pixels 40 are grouped as a unit and the via 23 is provided for each group, the signal line 26 leading to the via 23 is wired on the second chip 30 as illustrated in FIG. 16. The signal line 26 is connected with the current source 35. Further, the signal processing unit 31 is provided for each signal line 26.

Regarding the signal processing unit 31, while a configuration in which both the AD converter 51 and the memory unit 32 are provided together in the case of the second embodiment, the present embodiment has a configuration not including the memory unit 32. As such, the present embodiment adopts a configuration in which the memory unit 32 is provided outside the signal processing unit 31.

The AD converter 51 is configured to include a comparator (COMP) 511, an N-bit (N is an integer of two or larger) counter 512, and a latch unit 513. In the AD converter 51, the latch unit 513 is formed of a N-bit unit circuit (latch circuit) of the counter 512, and latches digital data of one pixel (pixel data) which is subjected to AD conversion by the actions of the comparator 511 and the counter 512, and subjected to CDS by the up/down count operation by the counter 512.

It should be noted that as the row decoder 37, a row decoder $37_1$ which selects the latch unit 513 in the signal processing unit 31 and a row decoder $37_2$ which selects respective cells in the memory unit 32 on a row basis are provided.

[4-3. Circuit Operation]

Next, circuit operation of the solid-state imaging device 10C according to the third embodiment, configured as described above, will be described.

With respect to one pixel in a pixel unit selected according to address designation by a row selection signal VSEL and a column selection signal HSEL, a pixel signal thereof is subjected to AD conversion by the AD converter 51, and digital data obtained through CDS processing by the up/down count operation by the counter 512 is latched to the latch unit 513. Then, by selecting the digital data latched to the latch unit 513 using a selection signal RSEL provided by the row decoder $37_1$, the data is sequentially read by the sense amplifier of the column decoder/sense amplifier 39. Then, pipeline operation is performed by performing writing operation into the memory unit 32 through the data latch unit 53 on a plurality of pixels, simultaneously.

In this way, operation of pixel selection and AD conversion is performed by a raster scan method, and operation of writing digital data after CDS processing by the counter 512 into the memory unit 32 is performed through the latch unit 513 and the sense amplifier of the column decoder/sense amplifier 39.

It should be noted that it is possible to make the readout speed faster by arranging a plurality of AD converters 51 and reading signals simultaneously from two or more pixels, rather than performing AD conversion on a pixel basis.

Further, regarding the latch unit 513, if it is difficult to arrange unit circuits (latch circuits) for N bits of the counter 512, it is possible to arrange unit circuits on a several-bit basis which is smaller than N bits, and after performing selection by a selection signal RSEL on the several bit basis, performing readout by the sense amplifier of the column decoder/sense amplifier 39 and performs writing to the memory unit 32. Thereby, it is possible to form a pixel unit with the smaller number of pixels, which provides an advantage that the readout speed becomes faster.

Regarding the data stored in the memory unit 32, it is possible to output (read) data at a low speed by reading it through the data latch unit 53 and the column decoder/sense amplifier 39.

Then, same as the solid-state imaging devices 10A and 10B according to the first and second embodiments, when pixel data is read from the memory unit 32, control to stop operation of the current source 35 and operation of at least the AD converter 51 of the signal processing unit 31 is performed. Here, as a pixel-parallel AD conversion method is adopted even in the solid-state imaging device 10C according to the present embodiment, which is the same as the case of the solid-state imaging device 10B according to the second embodiment, readout speed of pixel signals can be faster. Thereby, as a longer stopped period of the AD converter 51 can be taken, it is possible to further reduce the power consumption.

[4-4. Layout of Layered Chip]

Figure 17:
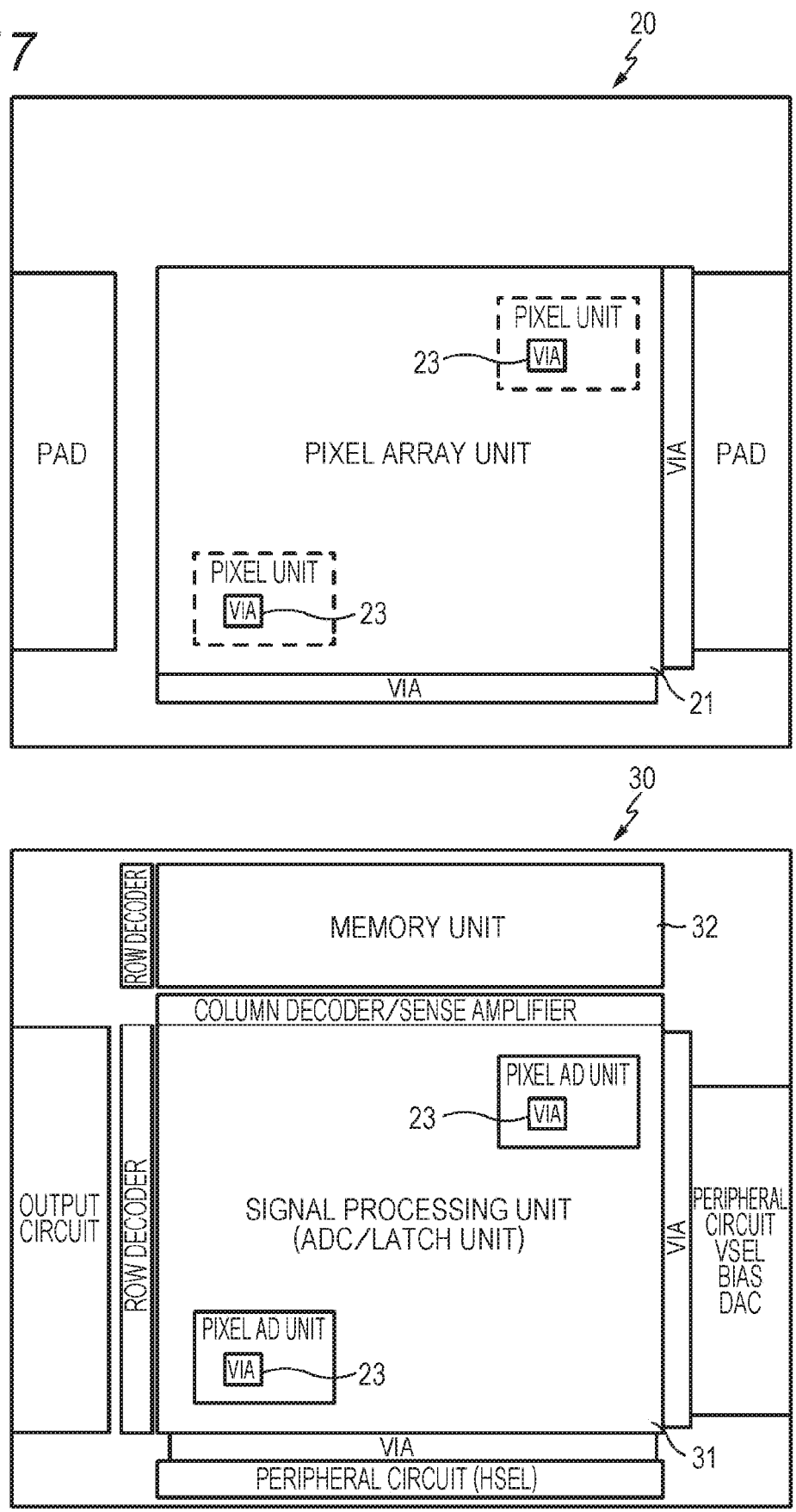
FIG. 17 is a layout diagram illustrating an exemplary layout of a layered chip in the solid-state imaging device according to the third embodiment.

FIG. 17 is a layout diagram illustrating an exemplary layout of a layered chip in the solid-state imaging device 10C according to the third embodiment.

As illustrated in FIG. 17, on the first chip 20, the pixel array unit 21 is configured such that pixels units, in which a predetermined number of pixels form one unit, are two-dimensionally arranged in a matrix, and the via 23 is formed for each pixel unit. On the other hand, on the second chip 30, circuitry including the AD converter 51 and the like (in the drawing, pixel AD unit) is provided corresponding to the pixel unit of the pixel array unit 21, the via 23 is formed corresponding to the pixel unit for each pixel AD unit, and further, the memory unit 32 is provided outside the region on which the signal processing unit 31 is formed.

It should be noted while FIG. 15 exemplary illustrates the case of adopting a configuration in which the row selection unit 25 and the column selection unit 27 are provided on the first chip 20 side, it is possible to adopt a configuration in which they are provided as peripheral circuitry (HSEL, VSEL) on the second chip 30 side, as illustrated in the exemplary layout of FIG. 17. If such a configuration is adopted, there is an advantage that a larger area of the first chip 20 can be used as a region for the pixel array unit 21.

FIG. 18 is a layout diagram illustrating another exemplary layout of a layered chip in the solid-state imaging device 10C according to the third embodiment.

While the above-described exemplary layout adopts a layered structure of having two layers in which two chips, namely the first chip 20 and the second chip 30, are layered, the present exemplary layout adopts a layered structure having three layers in which three chips, namely the first chip 20, the second chip 30, and a third chip 60, are layered. However, the present embodiment is not limited to a layered structure having three layers, and a layered structure having four or more layers is also acceptable.

As illustrated in FIG. 18, the present exemplary layout has a structure in which the pixel array unit 21 is disposed on the first chip 20, circuitry (in the drawing, pixel AD unit) including the AD converter 51 is disposed on the second chip 30, the memory unit 32 is disposed on the third chip 60, which are laminated such that the second chip 30 is placed in the middle, for example. It should be noted that while the layered sequence of the first chip 20, the second chip 30, and the third chip 60 is arbitrary, it is preferable to place the second chip 30, on which the circuitry including the control unit 34 is mounted, in the middle because the first chip 20 and the third chip 60, to be controlled by the control unit 34, locate immediately above and immediately below the second chip 30.

As in the present exemplary layout, by adopting a configuration in which the memory unit 32 is provided on the third chip 60 which is a chip other than the second chip 30 on which the circuitry including the AD converter 51 and the like and the peripheral circuitry including the control unit 34 are provided, it is possible to reduce the chip area, compared with the exemplary layout in which the memory unit 32 is provided on the second chip 30. This is obvious from a comparison between FIG. 17 and FIG. 18. In that case, a configuration in which the second chip 30 on which the circuitry including the AD converter 51 and the like is mounted and the third chip 60 on which the memory unit 32 and the like are mounted are connected with each other using a via (via 2) is considered. The vias (via 1/via 2) allowing an electrical connection between the chips can be realized by a well-known inter-wiring bonding technique.

[4-5. Actions and Advantageous Effects of Third Embodiment]

According to the solid-state imaging device 10C according to the third embodiment described above, as readout speed of pixel signals can be faster by using a pixel-parallel AD conversion method, which is the same as the solid-state imaging device 10B according to the second embodiment, it is possible to take a longer stopped period of the AD converter 51. Accordingly, it is possible to further reduce the power consumption compared with the case of the solid-state imaging device 10A according to the first embodiment using a column-parallel AD conversion method.

Further, the solid-state imaging device 10C according to the present embodiment adopts a configuration in which the memory unit 32 is provided outside the signal processing unit 31, which is different from the solid-state imaging device 10B on the second embodiment in which both the AD converter 51 and the memory unit 32 are provided together in the signal processing unit 31. Thereby, the solid-state imaging device 10C according to the present embodiment is adaptable to a case where it is difficult to realize well isolation of an analog circuit such as DRAM and the memory unit 32.

5. Another Exemplary Configuration

In each of the embodiments described above, while description has been given on the case of applying the technology to a solid-state imaging device having a layered structure as an example, the technology of the present disclosure is not limited to application to a solid-state imaging device having a layered structure. That is, a technology of performing low-speed readout by intermittent driving, in which operation of the current source 35 and operation of at least the AD converter 51 of the signal processing unit 31 are stopped at the time of readout of pixel data from the memory unit 32, is also applicable to a so-called flat-type solid-state imaging device formed such that the pixel array unit 21 and the peripheral circuits thereof are arranged on the same substrate (chip).

However, as the solid-state imaging devices of the second and third embodiments use a pixel-parallel AD conversion method, it can be said that a solid-state imaging device having a layered structure is preferable because it is able to adopt a connection structure in which a pixel unit of the pixel array unit 21 and a pixel AD unit of the signal processing unit 31 can be directly connected through the via 23.

6. Electronic Equipment

A solid-state imaging device to which the technology of the present discourse is applicable can be used as an imaging unit (image capturing unit) in electronic equipment in general including imaging devices such as a digital still camera and a video camera, a mobile terminal device having an imaging function such as a mobile telephone, a copying machine using a solid-state imaging device for an image reading unit, and the like. It should be noted that there is a case where a mode in the above-described module state to be mounted on electronic equipment, that is, a camera module, is used as an imaging device.

[Imaging Device]

Figure 19:
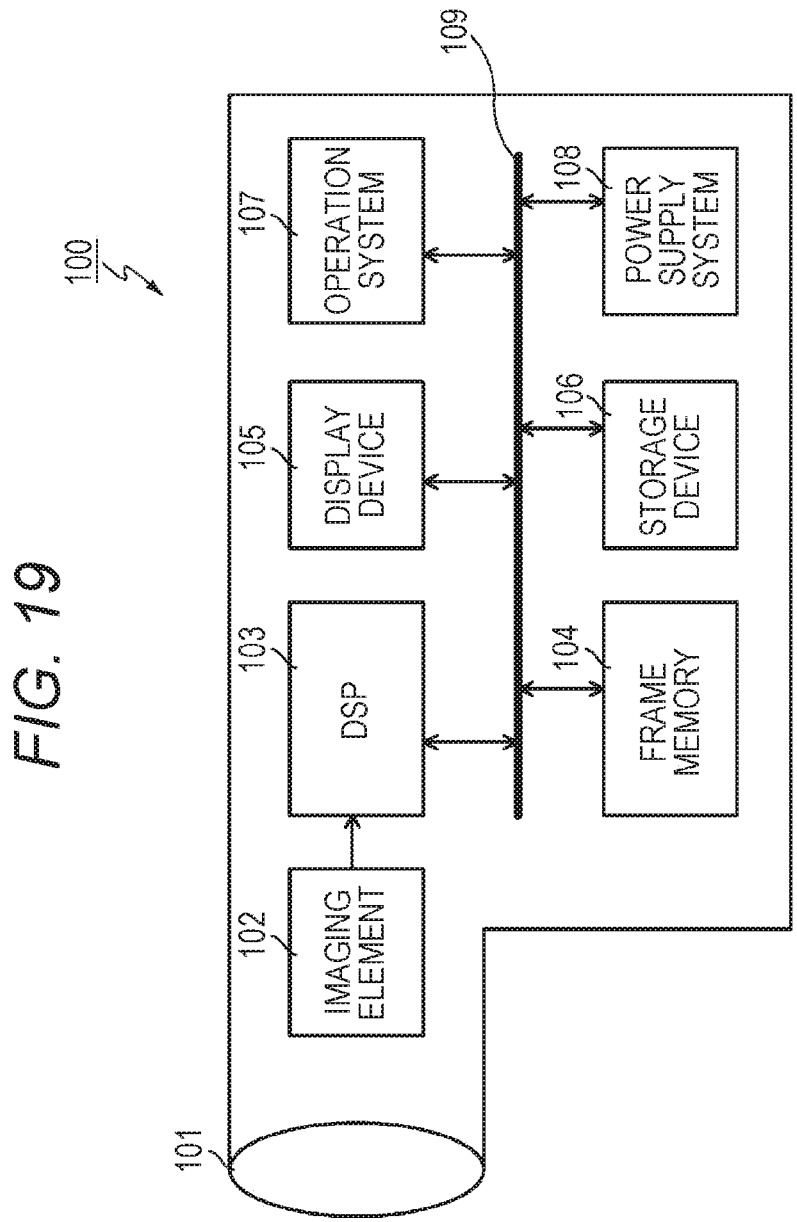
FIG. 19 is a block diagram illustrating an exemplary configuration of an imaging device which is an example of electronic equipment of the present disclosure.

FIG. 19 is a block diagram illustrating an exemplary configuration of an imaging device (camera device) which is an example of electronic equipment of the present disclosure.

As illustrated in FIG. 19, an imaging device 100 of the present disclosure includes an optical system including a lens group 101, an imaging element 102, a DSP circuit 103 which is a camera signal processing unit, a frame memory 104, a display device 105, a recording device 106, an operation system 107, a power supply system 108, and the like. The imaging device 100 is configured such that the DSP circuit 103, the frame memory 104, the display device 105, the recording device 106, the operation system 107, and the power supply system 108 are connected with one another over a bus line 109.

The lens group 101 takes in an incident light (image light) from a subject and forms an image on an imaging face of the imaging element 102. The imaging element 102 converts the light quantity of the incident light imaged on the imaging face by the lens group 101 into an electric signal on a pixel basis, and outputs it as a pixel signal.

The display device 105 is formed of a panel display device such as a liquid crystal display device, an organic EL (electro luminescence) display device, or the like, and displays moving images or still images imaged by the imaging element 102. The recording device 106 records moving images or still images imaged by the imaging element 102 on a recording medium such as a memory card, a videotape, a DVD (Digital Versatile Disk), or the like.

The operation system 107 issues operation commands relating to various functions of the imaging device 100 under the operation by a user. The power supply system 108 appropriately supplies various types of power source serving as operation power source of the DSP circuit 103, the frame memory 104, the display device 105, the recording device 106, and the operation system 107, to these supply targets.

The imaging device 100 configured as described above is applicable to a camera module for mobile devices such as a video camera, a digital still camera, a mobile telephone, and the like. In such an imaging device 100, a solid-state imaging device according to each of the embodiments described above, capable of realizing high-speed readout of pixel data in lower power consumption, can be used as the imaging element 102. This largely contributes to reduction of power consumption in the imaging device 100.

7. Configuration of Present Disclosure

It should be noted that the present disclosure is also able to adopt a configuration as described below.

[1] A solid-state imaging device including:
a signal processing unit including an AD converter that digitizes an analog pixel signal read from each pixel of a pixel array unit to a signal line, the signal processing unit transferring digitized pixel data at a first speed higher than a frame rate;
a memory unit that stores the pixel data transferred from the signal processing unit;
a data processing unit that reads pixel data at a second speed lower than the first speed from the memory unit; and
a control unit that, when the pixel data is read from the memory unit, controls to stop operation of a current source connected with the signal line and operation of at least the AD converter of the signal processing unit.

[2] The solid-state imaging device according to [1], wherein
the control unit stops the operation of the current source and the operation of the AD converter on a vertical synchronization signal basis.

[3] The solid-state imaging device according to [1] or [2], wherein
the signal processing unit, the memory unit, the data processing unit, and the control unit are formed on at least one chip which is different from a chip on which the pixel array unit is formed, and
the solid-state imaging device has a structure in which the chip on which the pixel array unit is formed and another at least one chip are layered.

[3A] The solid-state imaging device according to [3], wherein
the pixel array unit is formed on a first chip,
the signal processing unit, the memory unit, the data processing unit, and the control unit are formed on a second chip, and
the solid-state imaging device has a structure in which the first chip and the second chip are layered.

[3B] The solid-state imaging device according to [3], wherein
the pixel array unit is formed on a first chip,
the signal processing unit and the control unit are formed on a second chip,
the memory unit and the data processing unit are formed on a third chip, and
the solid-state imaging device has a structure in which the first chip, the second chip, and the third chip are layered.

[4] The solid-state imaging device according to [3], wherein
the control unit controls a circuit on the side of the chip on which the pixel array unit is formed and a circuit on the side of the other at least one chip, in synchronization with each other.

[5] The solid-state imaging device according to any of [1] to [4], wherein
the signal processing unit performs signal processing on the analog pixel signals read on a per-pixel-row basis from the pixels of the pixel array unit, in parallel on a per-pixel-column basis.

[6] The solid-state imaging device according to [5], wherein
the signal processing unit includes
a data latch unit that latches the pixel data digitized by the AD converter; and
a parallel-serial conversion unit that converts pixel data output from the data latch unit from parallel data to serial data, and
transfers the pixel data digitized by the AD converter to the memory unit by pipeline transfer.

[7A] The solid-state imaging device according to [6], wherein
the signal processing unit performs digitization processing by the AD converter within one horizontal period, and transfers the digitized pixel data to the data latch unit within next one horizontal period.

[7B] The solid-state imaging device according to [6], wherein
the signal processing unit performs digitization processing by the AD converter within one horizontal period, and transfers the digitized pixel data to the memory unit through the data latch unit and a column decoder within next one horizontal period.

[8] The solid-state imaging device according to [5], wherein
the signal processing unit includes:
a data latch unit that latches the pixel data digitized by the AD converter;
a data compression unit that compresses pixel data output from the data latch unit; and
a parallel-serial conversion unit that converts pixel data output from the data compression unit from parallel data to serial data, and
transfers the pixel data digitized by the AD converter to the memory unit by pipeline transfer.

[9A] The solid-state imaging device according to [8], wherein
the signal processing unit performs digitization processing by the AD converter within one horizontal period, and transfers the digitized pixel data to the data latch unit within next one horizontal period.

[9B] The solid-state imaging device according to [8], wherein
the signal processing unit performs digitization processing by the AD converter within one horizontal period, and transfers the digitized pixel data to the memory unit through the data latch unit and a column decoder within next one horizontal period.

[10] The solid-state imaging device according to any of [5] to [9], wherein
the signal processing unit includes two or more AD converters, and performs signal processing for digitization in parallel in the two or more AD converters.

[11] The solid-state imaging device according to [10], wherein
the two or more AD converters are arranged separately on both sides in an extending direction of the signal line of the pixel array unit.

[12] The solid-state imaging device according to any of [1] to [4], wherein
the current source, the signal processing unit, and the memory unit, connected with the signal line, are provided on a per-unit basis, the unit being formed of a predetermined number of pixels, and
the signal processing unit performs signal processing on the analog pixel signals, read by the unit of the predetermined number of pixels from the respective pixels of the pixel array unit, in parallel by the unit.

[13] The solid-state imaging device according to [12], wherein
the signal processing unit performs signal processing on the analog pixel signals, read by the unit of the predetermined number of pixels, in a predetermined sequence regarding the pixels in the unit.

[14] The solid-state imaging device according to any of [1] to [13], wherein
the data processing unit includes a decoder that designates a column address to the memory unit, and a sense amplifier that reads pixel data of the designated address, and
reads the pixel data from the memory unit through the sense amplifier and the decoder.

[15] The solid-state imaging device according to any of [1] to [14], wherein
the data processing unit reads the pixel data from the memory unit during an exposure period.

[16] The solid-state imaging device according to any of [1] to [15], wherein
when the control unit stops the operation of the current source connected with the signal line, the control unit interrupts a current path between the signal line and the current source.

[17] The solid-state imaging device according to [16], wherein
when the control unit interrupts the current path between the signal line and the current source, the control unit applies a fixed potential to the signal line.

[18] A solid-state imaging device including a plurality of layered chips including a chip on which a pixel array unit is formed, wherein
a signal processing unit including an AD converter that digitizes an analog pixel signal read from each pixel of the pixel array unit to a signal line, the signal processing unit transferring digitized pixel data at a first speed higher than a frame rate;
a memory unit that stores the pixel data transferred from the signal processing unit;
a data processing unit that reads pixel data at a second speed lower than the first speed from the memory unit; and
a control unit that, when the pixel data is read from the memory unit, controls to stop operation of a current source connected with the signal line and operation of at least the AD converter of the signal processing unit,
are formed on at least one chip different from the chip on which the pixel array unit is formed.

[18A] The solid-state imaging device according to [18], wherein
the solid-state imaging device includes a first chip and a second chip which are laminated,
on the first chip, the pixel array unit is formed, and
on the second chip, the signal processing unit, the memory unit, the data processing unit, and the control unit are formed.

[18B] The solid-state imaging device according to [18], wherein
the solid-state imaging device includes a first chip, a second chip, and a third chip which are laminated,
on the first chip, the pixel array unit is formed,
on the second chip, the signal processing unit, the data processing unit, and the control unit are formed, and
on the third chip, the memory unit is formed.

[19] A driving method of a solid-state imaging device, the method including,
in driving the solid-state imaging device including:
a signal processing unit including an AD converter that digitizes an analog pixel signal read from each pixel of a pixel array unit to a signal line, the signal processing unit transferring digitized pixel data at a first speed higher than a frame rate;
a memory unit that stores the pixel data transferred from the signal processing unit; and
a data processing unit that reads pixel data at a second speed lower than the first speed from the memory unit,
when reading the pixel data from the memory unit, performing driving to stop operation of a current source connected with the signal line and operation of at least the AD converter of the signal processing unit.

[20] Electronic equipment including a solid-state imaging device including:
a signal processing unit including an AD converter that digitizes an analog pixel signal read from each pixel of the pixel array unit to a signal line, the signal processing unit transferring digitized pixel data at a first speed higher than a frame rate;
a memory unit that stores the pixel data transferred from the signal processing unit;
a data processing unit that reads pixel data at a second speed lower than the first speed from the memory unit; and
a control unit that, when the pixel data is read from the memory unit, controls to stop operation of a current source connected with the signal line and operation of at least the AD converter of the signal processing unit.

REFERENCE SIGNS LIST

10A Solid-state imaging device according to a first embodiment
10B Solid-state imaging device according to a second embodiment
10C Solid-state imaging device according to a third embodiment
20 First chip
21 Pixel array unit (pixel unit)
$22_1$, $22_2$ Pad
23 ($23_1$ to $23_4$) Via
25 Row selection unit
26 Signal line
27 Column selection unit
30 Second chip
31 Signal processing unit
32 ($32_1$ to $32_2$, $32_{13}$ to $32_{24}$) Memory unit
33 Data processing unit 34 Control unit
35 Current source
36 Decoder
37 Row decoder
38 Interface (IF) unit
39 Column decoder/sense amplifier
40 Unit pixel
41 Photodiode
42 Transfer transistor (transfer gate)
43 Reset transistor
44 Amplification transistor
45, 47 Selection transistor
46 FD unit
51 ($51_1$ to $51_4$) AD converter
52 Reference voltage generation unit
53 ($53_A$, $53_B$) Data latch unit
54 Para/seri (parallel-serial) conversion unit
55 ($55_A$, $55_B$) Multiplexer
56 Data compression unit
60 Third chip

The invention claimed is:

1. A solid-state imaging device comprising:
   a first substrate including:
      a pixel array unit including a plurality of pixels, and
      a plurality of vias on a periphery of the first substrate; and
   a second substrate including:
      signal processing circuitry including an AD converter configured to digitize an analog pixel signal read from respective ones of the plurality of pixels through corresponding ones of the plurality of vias, the signal processing circuitry configured to transfer digitized pixel data at a first speed higher than a frame rate;
      a memory configured to store the pixel data transferred from the signal processing circuitry;
      data processing circuitry configured to read pixel data at a second speed lower than the first speed from the memory; and
      control circuitry configured to, when the pixel data is read from the memory unit, stop operation of a current source connected with the signal line and operation of at least the AD converter of the signal processing circuitry.

2. The solid-state imaging device according to claim 1, wherein
   the control circuitry is configured to stop the operation of the current source and the operation of the AD converter on a vertical synchronization signal basis.

3. The solid-state imaging device according to claim 1, wherein
   the first substrate and the second substrate are layered.

4. The solid-state imaging device according to claim 3, wherein
   the control circuitry is configured to control a circuit on the first substrate and a circuit on the side of the second substrate, in synchronization with each other.

5. The solid-state imaging device according to claim 1, wherein
   the signal processing circuitry is configured to perform signal processing on the analog pixel signals read on a per-pixel-row basis from the pixels of the pixel array unit, in parallel on a per-pixel-column basis.

6. The solid-state imaging device according to claim 5, wherein
   the signal processing circuitry includes
      a data latch configured to latch the pixel data digitized by the AD converter; and
      a parallel-serial converter configured to convert pixel data output from the data latch from parallel data to serial data, and
   to transfer the pixel data digitized by the AD converter to the memory by pipeline transfer.

7. The solid-state imaging device according to claim 6, wherein
   the signal processing circuitry is configured to perform digitization processing by the AD converter within one horizontal period, and to transfer the digitized pixel data to the data latch within next one horizontal period.

8. The solid-state imaging device according to claim 5, wherein
   the signal processing circuitry includes:
      a data latch configured to latch the pixel data digitized by the AD converter;
      data compression circuitry configured to compress pixel data output from the data latch; and
      a parallel-serial converter configured to convert pixel data output from the data compression unit circuitry from parallel data to serial data, and
   to transfer the pixel data digitized by the AD converter to the memory by pipeline transfer.

9. The solid-state imaging device according to claim 5, wherein
   the signal processing circuitry includes two or more AD converters, and is configured to perform signal processing for digitization in parallel in the two or more AD converters.

10. The solid-state imaging device according to claim 9, wherein
    the two or more AD converters are arranged separately on both sides in an extending direction of the signal line of the pixel array unit.

11. The solid-state imaging device according to claim 1, wherein
    the current source, the signal processing circuitry, and the memory, connected with the signal line, are provided on a per-unit basis, the unit being formed of a predetermined number of pixels, and
    the signal processing circuitry is configured to perform signal processing on the analog pixel signals, read by the unit of the predetermined number of pixels from the respective pixels of the pixel array unit, in parallel by the unit.

12. The solid-state imaging device according to claim 11, wherein
    the signal processing circuitry is configured to perform signal processing on the analog pixel signals, read by the unit of the predetermined number of pixels, in a predetermined sequence regarding the pixels in the unit.

13. The solid-state imaging device according to claim 1, wherein
    the data processing circuitry includes a decoder configured to designate a column address to the memory, and a sense amplifier configured to read pixel data of the designated address, and
    to read the pixel data from the memory through the sense amplifier and the decoder.

14. The solid-state imaging device according to claim 1, wherein
    the data processing circuitry is configured to read the pixel data from the memory during an exposure period.

15. The solid-state imaging device according to claim 1, wherein
when the control circuitry stops the operation of the current source connected with the signal line, the control unit is configured to interrupt a current path between the signal line and the current source.

16. The solid-state imaging device according to claim 15, wherein
when the control circuit interrupts the current path between the signal line and the current source, the control circuit is configured to apply a fixed potential to the signal line.

17. A driving method of a solid-state imaging device, the method comprising,
in driving the solid-state imaging device including:
a first substrate including:
a pixel array unit including a plurality of pixels, and
a plurality of vias on a periphery of the first substrate; and
a second substrate including:
signal processing circuitry including an AD converter configured to digitize an analog pixel signal read from respective ones of the plurality of pixels through corresponding ones of the plurality of vias, the signal processing circuitry configured to transfer digitized pixel data at a first speed higher than a frame rate;
a memory configured to store the pixel data transferred from the signal processing circuitry; and
data processing circuitry configured to read pixel data at a second speed lower than the first speed from the memory,
when reading the pixel data from the memory, performing driving to stop operation of a current source connected with the signal line and operation of at least the AD converter of the signal processing circuitry.

18. Electronic equipment comprising a solid-state imaging device comprising:
a signal processing unit including an AD converter that digitizes an analog pixel signal read from each pixel of a pixel array unit to a signal line, the signal processing unit transferring digitized pixel data at a first speed higher than a frame rate;
a memory unit that stores the pixel data transferred from the signal processing unit;
a data processing unit that reads pixel data at a second speed lower than the first speed from the memory unit; and
a control unit that, when the pixel data is read from the memory unit, controls to stop operation of a current source connected with the signal line and operation of at least the AD converter of the signal processing unit.

19. A solid-state imaging device comprising:
a first substrate including:
a pixel array unit including a plurality of pixels, and
a plurality of first vias on a periphery of the first substrate;
a second substrate including:
signal processing circuitry including an AD converter configured to digitize an analog pixel signal read from respective ones of the plurality of pixels through corresponding ones of the plurality of first vias, the signal processing circuitry configured to transfer digitized pixel data at a first speed higher than a frame rate, and
control circuitry; and
a third substrate including:
a memory configured to store the pixel data transferred from the signal processing circuitry, and
data processing circuitry configured to read pixel data at a second speed lower than the first speed from the memory,
wherein the control circuitry is configured to, when the pixel data is read from the memory unit, stop operation of a current source connected with the signal line and operation of at least the AD converter of the signal processing circuitry.

20. The solid-state imaging device according to claim 19, wherein
the second substrate includes a plurality of second vias on a periphery of the second substrate, and
the memory is configured to store the pixel data transferred from the signal processing circuitry through corresponding ones of the plurality of second vias.

* * * * *